United States Patent
Czagas et al.

(10) Patent No.: US 6,441,447 B1
(45) Date of Patent: Aug. 27, 2002

(54) CO-PATTERNING THIN-FILM RESISTORS OF DIFFERENT COMPOSITIONS WITH A CONDUCTIVE HARD MASK AND METHOD FOR SAME

(75) Inventors: Joseph A. Czagas, Palm Bay; George Bajor, Melbourne; Leonel Enriquez, Melbourne; Chris A. McCarty, Melbourne, all of FL (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/367,325
(22) PCT Filed: Feb. 12, 1998
(86) PCT No.: PCT/US98/02855
§ 371 (c)(1), (2), (4) Date: Aug. 11, 1999
(87) PCT Pub. No.: WO98/35385
PCT Pub. Date: Aug. 13, 1998

(51) Int. Cl.[7] ............................................. H01L 29/76
(52) U.S. Cl. .................... 257/379; 257/536; 257/537; 257/766; 257/904
(58) Field of Search ............................. 257/379, 536, 257/537, 577, 766, 770, 773, 904

(56) References Cited

U.S. PATENT DOCUMENTS 5,128,745 A * 7/1992 Takasu et al. ............. 357/68
5,547,896 A * 8/1996 Linn et al. ................. 437/60
5,625,218 A * 4/1997 Yamadera et al. ......... 257/529
6,165,862 A * 12/2000 Ishikawa et al. .......... 438/384

FOREIGN PATENT DOCUMENTS

| EP | 0708482 A2 | 4/1996 | |
|---|---|---|---|
| EP | 0726597 A3 | 12/1997 | |
| JP | 63244865 | 10/1988 | |
| JP | 63-272064 A * | 11/1988 | ........... H01L/27/04 |
| JP | 01073659 | 3/1989 | |
| JP | 02068901 | 8/1990 | |
| JP | 6-61353 A * | 3/1994 | ........... 257/665 |

OTHER PUBLICATIONS

Akira Ito, et al, "A Fully Complementary BiCMOS Technology for 10 V Mixed–Signal Circuit Applications", *IEEE Transaction on Electron Devices*, vol. 41, No. 7, pp. 1149–1159 (Jul. 1994).

International Search Report.

* cited by examiner

*Primary Examiner*—Eddie Lee
*Assistant Examiner*—Matthew E. Warren
(74) *Attorney, Agent, or Firm*—Thomas R. FitzGerald

(57) ABSTRACT

A first thin film resistor formed by direct etch or lift off on a first dielectric layer that covers an integrated circuit in a substrate. A second thin film resistor comprised of a different material than the first resistor, formed by direct etch or lift off on the first dielectric layer or on a second dielectric layer over the first dielectric layer. The first and second thin film resistors are interconnected with another electronic device such as other resistors or the integrated circuit.

15 Claims, 18 Drawing Sheets

CO-PATTERNING THIN-FILM RESISTORS OF DIFFERENT COMPOSITIONS WITH A CONDUCTIVE HARD MASK AND METHOD FOR SAME

This application is a national stage application of PCT/US98/02855, filed Feb. 12, 1998, which is a CIP U.S. application Ser. No. 08/799,793 filed Feb. 12, 1997, now U.S. Pat. No. 5,976,944.

FIELD OF THE INVENTION

The invention relates in general to integrated circuits with thin film resistors.

BACKGROUND OF THE INVENTION

Thin-film resistors are generally considered to be more precise than resistors made by diffusion or by deposited polysilicon. This is due to the superior (lower) temperature coefficient of resistivity, and voltage coefficient of thin-film resistors, when compared to diffused resistors and polysilicon resistors. Also, thin-film resistors are formed much later in the process flow (usually just prior to the interconnect metallization deposition), than diffused resistors and polysilicon resistors. The effects of subsequent process steps on the properties of a thin-film resistor are thus minimized. In a typical thin film process, a dielectric layer is deposited over the semiconductor substrate, thin film resistor material is uniformly deposited on the dielectric layer, and the thin film resistor material is patterned into a geometric configuration that yields the desired resistance value. Thin film resistors are trimmed precisely by a laser trimmer to within a very small deviation from the desired resistance value.

Thin film, trimmable resistors may be used in high/low power analog and low power digital integrated circuits. In the past, integrated circuits have generally restricted the devices in any given circuit to either high/low power analog or low power digital applications. However, modern circuits integrate both analog and digital applications on a single chip. See, for example, U.S. Pat. No. 5,369,309, the entire disclosure of which is here and incorporated by reference. That patent describes an analog to digital converter and describes the simultaneous fabrication of high power and low power devices in a substrate. Precision thin film resistors are used to manufacture analog to digital converters, band-gap reference circuits, and subscriber line interface circuits (SLIC) for telephone systems.

Until recently, telephone line cards have been typically housed at locations where large power generators were readily available (i.e. central offices). Thus, the amount of power required for operating the SLICs contained in the line cards was relatively unimportant.

Optical fibers have very wide bandwidth and are capable of handling a large number of signals. A large number of telephone conversations and/or blocks of data transmission can be concentrated into a much smaller number of telephone cables made with optical fibers.

Unfortunately, optical fibers are unable to carry the D.C. power required to operate the telephone sets. It is impractical to supply power at the subscriber site. Such subscriber telephones would be incompatible with existing phone sets, and would depend on the power companies. In the event of a loss of utility power, a subscriber's phone would not work. The problem is solved by providing remote sites with relatively small power capabilities at several locations within the neighborhoods to compensate for the optical fiber D.C. power deficiency. With this new arrangement, signals from the central offices are transmitted to the appropriate remote sites where the line cards (and hence the SLICs) now reside. The SLICs then provide the signals and the power to the subscriber phones (and extensions) at the subscriber sites.

Since these remote sites have limited power generating capabilities, the power consumed by the SLICs has become a critical factor. Thus, new SLIC designs are expected to provide the high power required to make telephone sets operate properly, while minimizing the power consumption necessary to operate the SLIC itself. Furthermore, the relief in performance requirements that would logically follow from a closer proximity to the subscriber, have not materialized because expanded duties have been imposed on the SLIC function.

Low power applications require a material with high sheet resistance such as silicon chromium (sichrome, or SiCr). That material has a sheet resistance on the order of 2.0 kOhm per square. For high power applications, the material of choice could be nickel chromium (nichrome, or NiCr) which has a sheet resistance of about 200 Ohms per square. There is an order of magnitude of difference between the sheet resistance of sichrome and the sheet resistance of nichrome. If one uses higher power nichrome resistors for low power applications, there would be an insufficient amount of substrate area to form the low power resistors, which typically range between 10 kohms to 500 kOhms. This is especially critical in low-power applications and in circuits that require a critical ratio match for both low value resistor sets and high value resistor sets. In the latter case, a diffused or implanted resistor is typically used for the low value portion of the combination. A diffused resistor is made by connecting a metal interconnect (such as aluminum) to a silicon diffusion or implant through contact apertures cut through a field oxide (typically $SiO_2$) at the ends of the diffusion or implant. The silicon diffusion or implant serves as the resistor material.

As such, there remains a long felt and unfilled need to provide resistor sets in which high value resistors are precisely matched and low value precise resistors are also precisely matched. There is also a need for sets of high and low power resistors with very low temperature coefficients as well as low voltage coefficients over the operating range of the device. There is also a need for precision resistors with significantly different sheet resistance values that are formed on the same die or wafer. There is a further need for thin film resistors of different materials formed on the same dielectric layer or formed on different dielectric layers.

SUMMARY OF THE INVENTION

The foregoing needs are met by the invention. The invention provides a method for forming first and second thin film resistors of different first and second resistor materials on a first dielectric layer or on first and second dielectric layers. The invention forms the first and second thin film resistors by direct etching or lift off or by a combination of direct etching and lift off.

The invention provides a method for forming first and second thin film resistors of respective first and second different materials on first and second dielectric layers. The first and second dielectric layers are separated by a metal interconnect layer, preferably aluminum. The first resistor is formed on the first dielectric layer by either direct etching or by lift off. The first dielectric layer is suitably patterned to provide apertures for the metal interconnect to contact the underlying integrated circuit that has been formed in the substrate. The metal interconnect layer is sputter deposited over the first dielectric layer and over the first thin film resistor. The apertures in the dielectric layer provide alignment targets for patterning the resulting metal interconnect layer in order to expose the first thin film resistors which may be suitably trimmed to their desired resistance. A second dielectric layer is uniformly deposited over the surface and a layer of second thin film resistor material is deposited over the second dielectric layer. The second resistor material is different from the first resistor material that forms the first thin film resistors. The second resistor material is suitably patterned to provide the second thin film resistors. The second dielectric layer is likewise patterned and vias are opened to at least the underlying first interconnect layer. A second interconnect layer is deposited over the second dielectric layer and the second thin film resistors. The second interconnect layer is likewise patterned to expose the second thin film resistors. The second thin film resistor and the second interconnect layer are coated with a passivation layer, preferably silicon nitride.

The invention provides a method for forming first and second thin film resistors of respective first and second different materials on only a first dielectric layer. The first thin film resistor is formed on the first dielectric layer by either a lift off method or a direct etching method. The second thin film resistor is formed on the same first dielectric layer by either a lift off or a direct etching method. With the direct etching method, a layer of a second thin film resistor material is uniformly deposited over the first dielectric layer and over the first thin film resistor. Photoresist is deposited and patterned over the bulk of the second resistor material. The exposed portion of the second resistor material is subjected to a suitable etching agent that is selective between the first and second resistor materials and removes the second resistor material but does not remove the first resistor material or removes the first resistor material at a substantially lower rate than it removes the second resistor material. The resulting first and second thin film resistors on the first dielectric layer are coated with a first level interconnect layer of metal, preferably, aluminum. The first level interconnect layer is patterned to expose the first and second thin film resistors. The thin film resistors may be trimmed. A second dielectric layer is uniformly deposited over the first interconnect layer and the first and second thin film resistors. The second dielectric layer is patterned with vias extending at least to the first interconnect layer. The second level interconnect layer, (which is optional), preferably of aluminum, is uniformly deposited over the second dielectric layer. A passivation layer, typically silicon nitride, is deposited over the second level interconnect layer.

DETAILED DESCRIPTION OF THE INVENTION

Figure 1A:
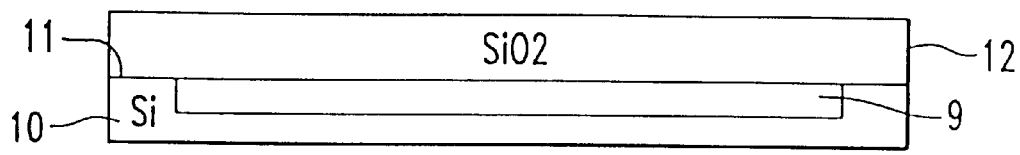
FIGS. 1a–1e show sequential steps in forming a first thin film resistor by a direct etching method.
Figure 1B:
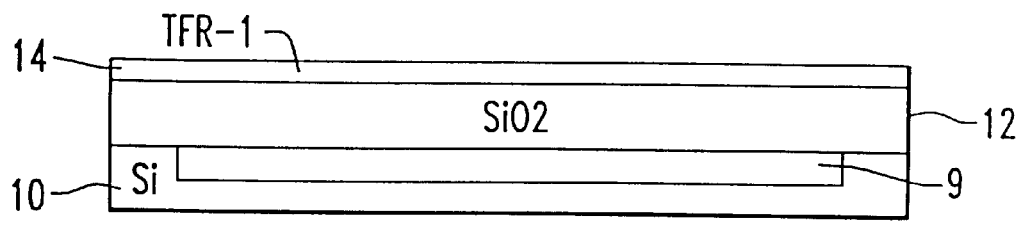

FIG. 1a shows a semiconductor substrate 10 comprising silicon or other suitable semiconductor material. An integrated circuit 9 is formed in the semiconductor substrate 10 by suitable processes. For example, the processes shown and described in U.S. Pat. No. 5,369,309 are suitable for fabricating the integrated circuit 9 in substrate 10. A first dielectric layer 12 is formed on surface 11 of the substrate 10. Dielectric layer 12 typically comprises silicon dioxide and is typically formed by thermal oxidation or by a chemical vapor deposition process. However, other dielectrics may be used, including but not limited to silicon nitride and diamond. Next, as shown in FIG. 1b, a layer of a first thin film resistor material 14 is uniformly deposited on the first dielectric layer 12. Layer 14 may comprise nichrome, sichrome, trinitride, tantalum nitride, doped sichrome (i.e., sichrome-B, sichrome-C) or any other suitable thin film resistor material known to those skilled in the art. The layer 14 is typically formed by any suitable PVD process such as evaporation or sputtering.

Figure 1C:
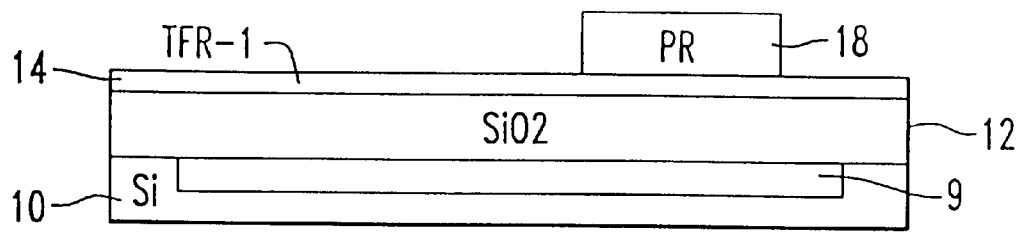
Figure 1D:
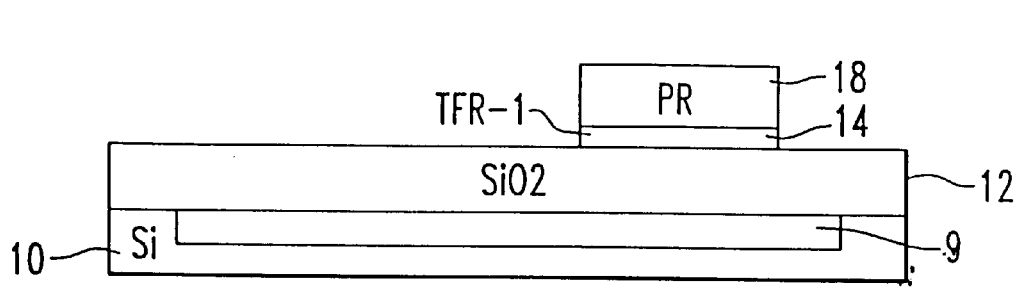
Figure 1E:
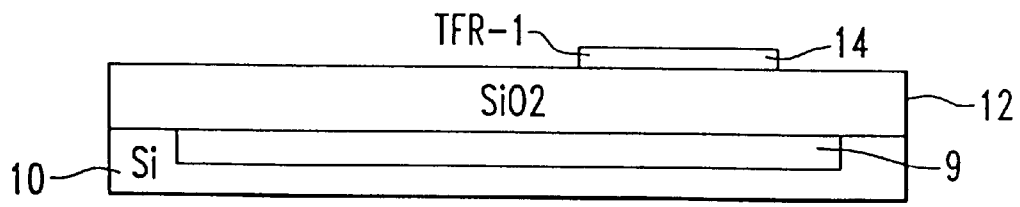

A layer of photoresist 18 is uniformly deposited on the thin film resistor material 14 and is patterned to the shape of the desired thin film resistor. The photoresist 18 (FIG. 1c) covers a portion of the thin film layer 14 and exposes the rest of the thin film resistor layer 14 to a suitable etching material. Photoresist is sensitive to light. For a positive photoresist, the exposed portion of the photoresist undergoes a photo-chemical reaction, that makes it soluble in the developer, while the unexposed portion remains insoluble in the developer. The opposite is true for a negative resist. All discussions herein related to photoresist will be using a positive photoresist, although a negative photoresist may be similarly employed. The exposed resist is removed and the remaining photoresist is then hard baked in order to provide an etch resistant mask over the remaining portion 14 of the first thin film resistor material. The exposed portion of the first thin film resistor layer 14 is etched as shown in FIG. 1d. Any suitable etchant that is selective with respect to photoresist is sufficient. The etching operation may be isotropic or anisotropic. Upon removal of the exposed portion of layer 14, the remaining photoresist 18 is striped to leave a first thin film resistor 14 on a first dielectric layer 12 as shown in FIG. 1e.

Figure 2A:
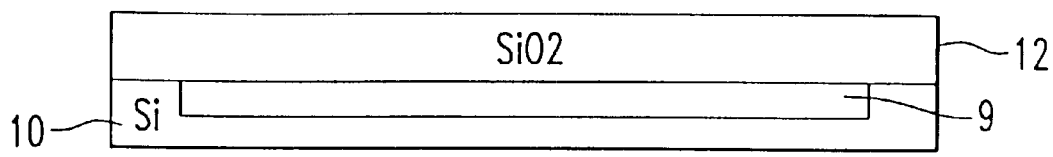
FIGS. 2a–2e show sequential steps in forming a first thin film resistor by a lift off method.
Figure 2B:
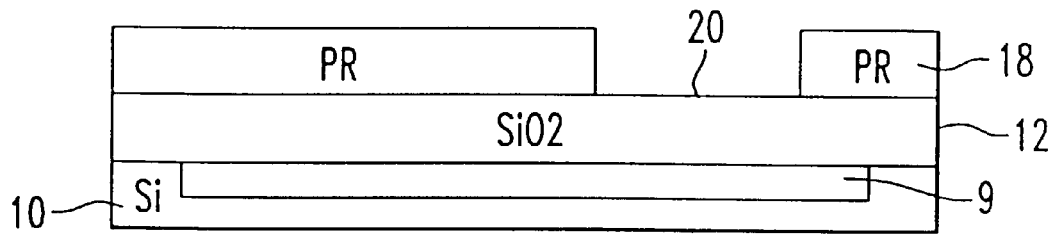
Figure 2C:
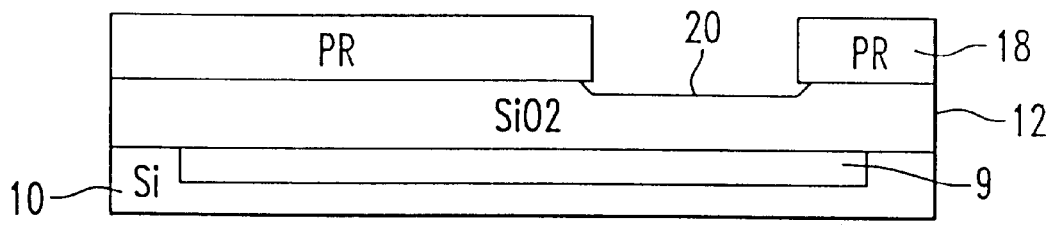
Figure 2D:
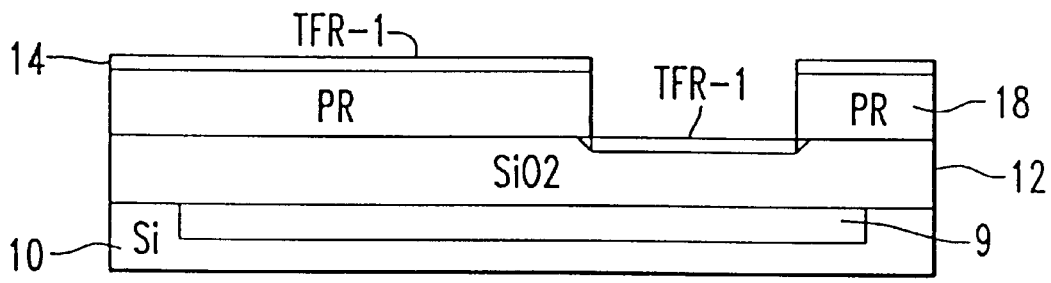
Figure 2E:
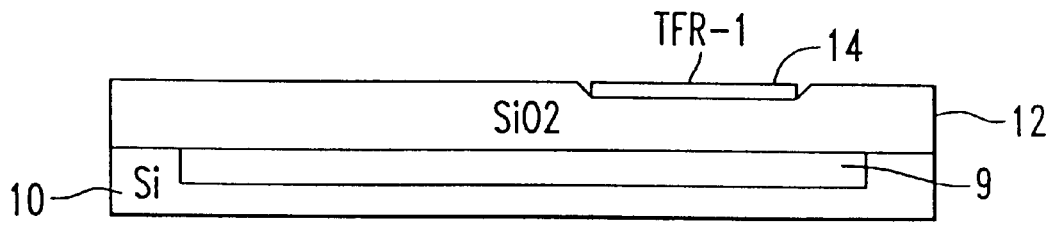

A lift off method is shown in FIGS. 2a–2e. FIG. 2a shows the first dielectric layer 12 on a substrate 10 comprising the integrated circuit 9. The first dielectric layer 12 is coated with a layer of photoresist 18. The photoresist 18 is suitably patterned to expose an area 20 for the location of the thin film resistor as shown in FIG. 2b. The photoresist is hard baked to provide a suitable mask. As shown in FIG. 2c, the exposed portion of the first dielectric layer 12 is partially etched to displace the exposed surface of the dielectric layer from the surface of the photoresist. As such, it creates a large step between the two levels thereby exposing the sidewalls of the photoresist to a lift off solvent. As shown in FIG. 2d, a uniform layer of first thin film resistor material 14 is deposited over the photoresist and the exposed portion 20 of the first level dielectric. The substrate 10 is subjected to a suitable solvent that removes the photoresist and results in the thin film resistor 14 as shown in FIG. 2e.

Figure 3A:
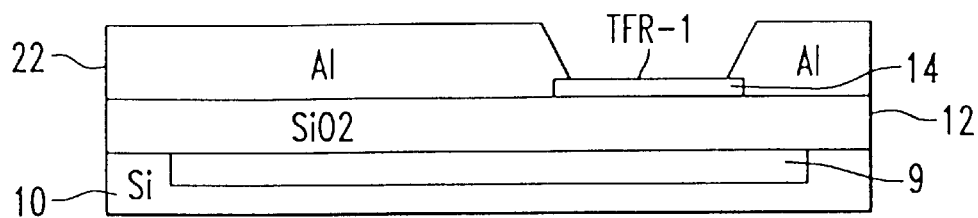
FIGS. 3a–3h show sequential steps in forming a second thin film resistor on a second dielectric layer by direct etching.

FIGS. 3a–3h show a direct etching method for forming a second thin film resistor 30 on a second dielectric layer 26 different from the first dielectric layer 12. With reference to FIG. 3a, the first thin film resistor 14 is formed by either the direct etch method of FIGS. 1a–1e or by the lift off method of FIGS. 2a–2e. It is preferred that the first thin film resistor 14 is formed by the direct etch method. The first level dielectric layer 12 is suitably patterned to provide apertures (not shown) extending at least to surface contact regions of the integrated circuit 9 in the substrate 10. A metal interconnect layer 22, preferably of aluminum, is suitably deposited uniformly over the first dielectric layer 12 and the first thin film resistor 14. Aluminum is preferably deposited by sputtering but may also be deposited by evaporative deposition. An aperture pattern (not shown) in the aluminum layer 22 provides suitable registration marks for locating the thin film resistor. Forming apertures and metal interconnect layers are well known to those skilled in the art. In an earlier step, not shown, the aluminum 22 is suitably patterned in order to expose the thin film resistor 14 and provide the structure as shown in FIG. 3a.

Figure 3B:
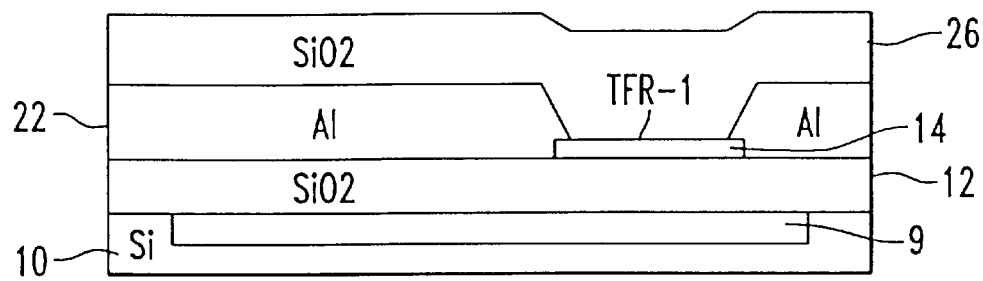
Figure 3C:
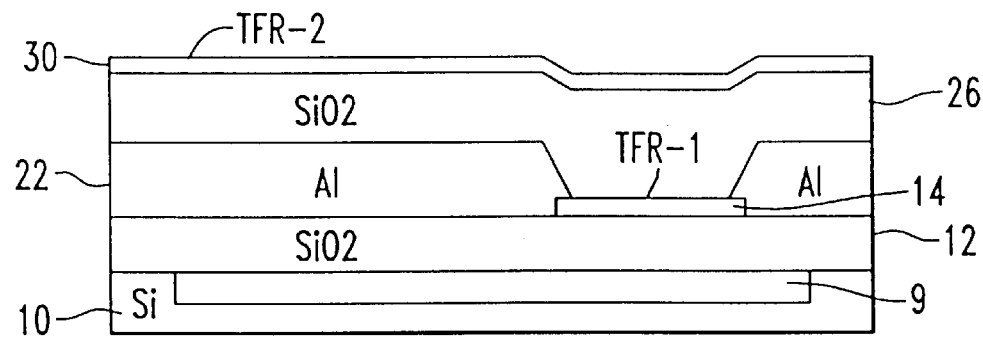

The thin film resistor 14 is then covered with a second dielectric layer 26 as shown in FIG. 3b. The second dielectric layer 26 is preferably silicon dioxide but may be any suitable dielectric including but not limited to silicon nitride and diamond.

Figure 3D:
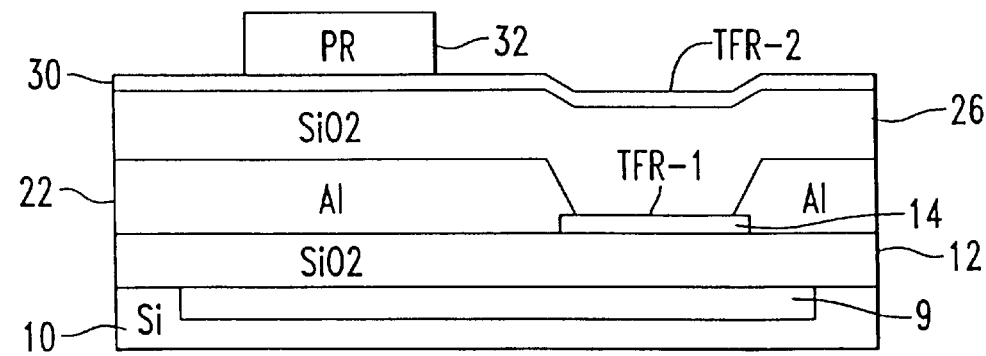
Figure 3E:
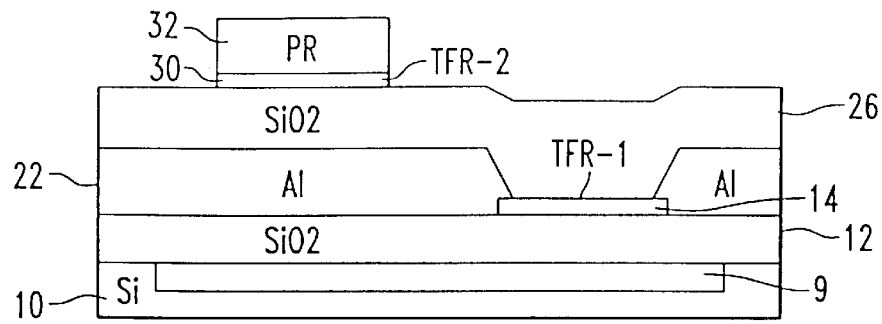

A second layer of thin film resistor material 30 is uniformly deposited over second dielectric layer 26. See FIG. 3c. The second thin film layer 30 is covered with a layer 32 of photoresist. The photoresist is suitably patterned, developed and hard baked to provide the structure as shown in FIG. 3d. That structure is etched to remove the exposed portions of layer 30 and provide the resulting structure as shown in FIG. 3e. Thereafter, the photoresist is stripped to provide the second thin film resistor 30 on the second dielectric layer 26 as shown in FIG. 3f.

Figure 3F:
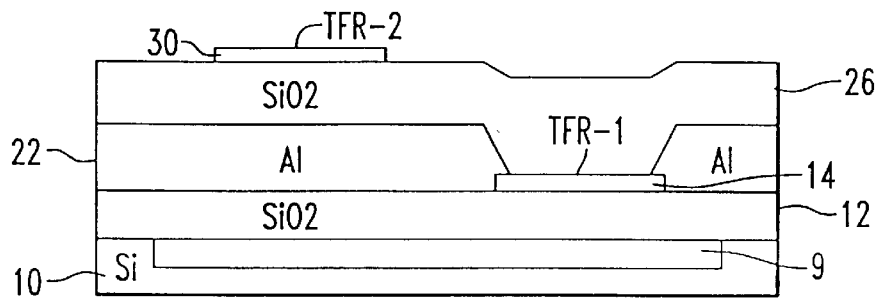

In a manner similar to that described at the beginning of this method, a second interconnect level 34 is formed over the structure of FIG. 3f. Prior to forming the interconnect layer 34, suitable vias are etched at least through second level dielectric layer 26 and extending to the first level interconnect layer 22. The vias may be further etched through the first dielectric layer 12 to contact the integrated circuit 9. After the layer 34 is deposited, it is suitably patterned to exposed the thin film resistor 30. A passivation dielectric layer 36, typically silicon nitride, is uniformly deposited over the structure as shown in FIG. 3h.

Figure 4A:
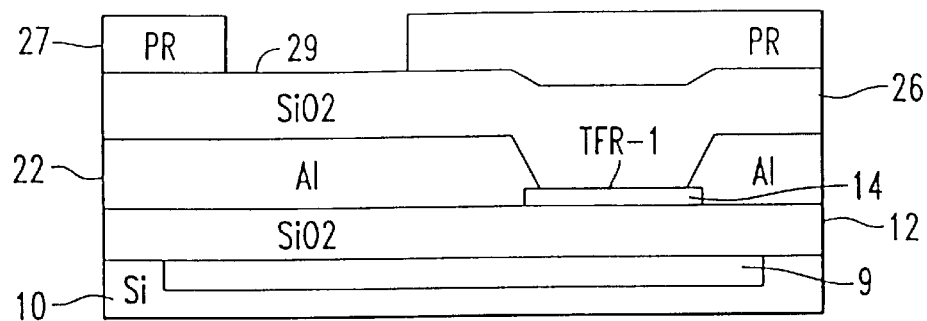
FIGS. 4a–4d are sequential steps in forming a second thin film resistor on a second dielectric layer by a lift off method.
Figure 4B:
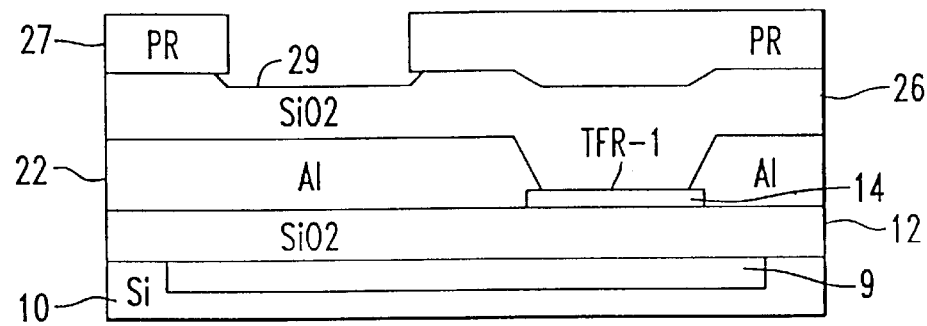
Figure 4C:
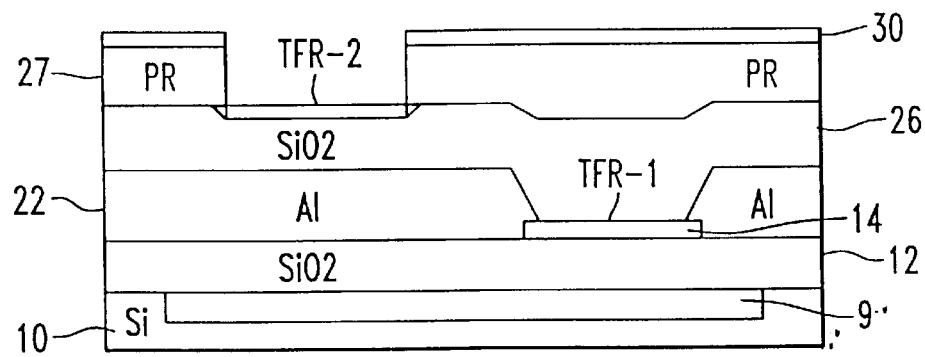
Figure 4D:
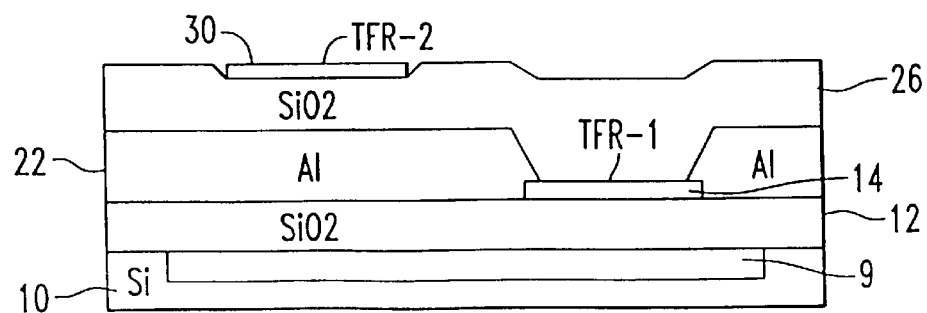

A second thin film resistor may also be formed by the lift off method as shown in FIGS. 4a–4d. The structure shown in FIG. 4a is formed by substantially the same steps described in connection with FIGS. 3a and 3b. After deposition of the second dielectric layer 26, a photoresist layer 27 is deposited over the second dielectric layer 26. A resist pattern 29 is etched into the exposed portion of the photoresist layer in order to assist the lift off process and into the second dielectric layer 26. The resist pattern 29 is shown in FIG. 4b. Next, as shown in FIG. 4c, the uniform layer of second thin film resistor material 30 is deposited over the structure of FIG. 4b. In a following step, the photoresist 27 is removed by a suitable solvent thereby leaving the second thin film resistor 30 on the second dielectric layer 26 as shown in FIG. 4d.

Figure 3G:
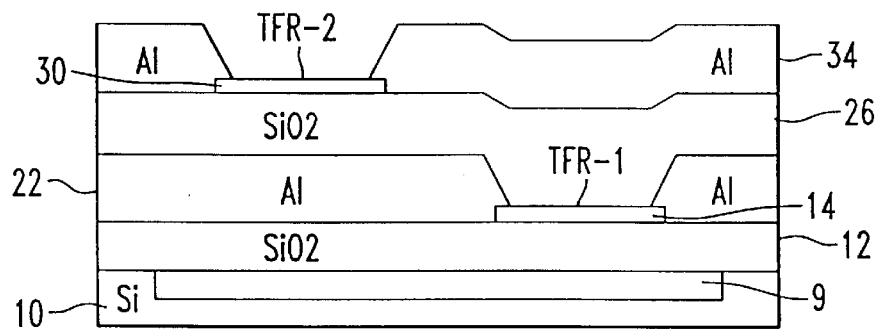
Figure 3H:
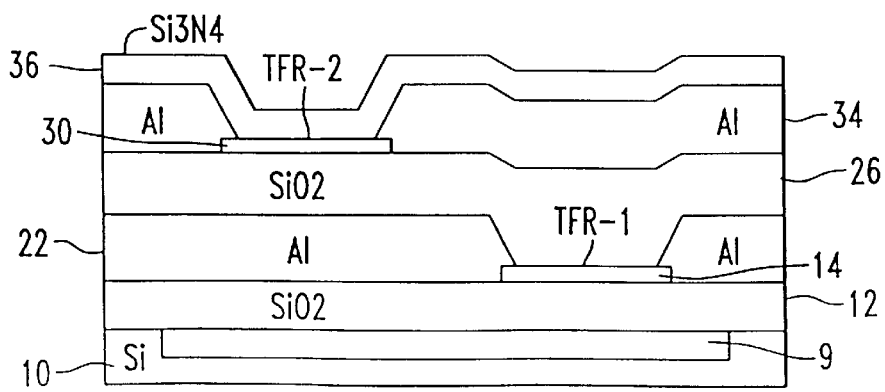

Those skilled in the art will appreciate that a second interconnect layer and a passivation layer may be formed over the structure shown in FIG. 4d in a manner substantially the same as that shown in FIGS. 3g and 3h and described above.

Figure 5A:
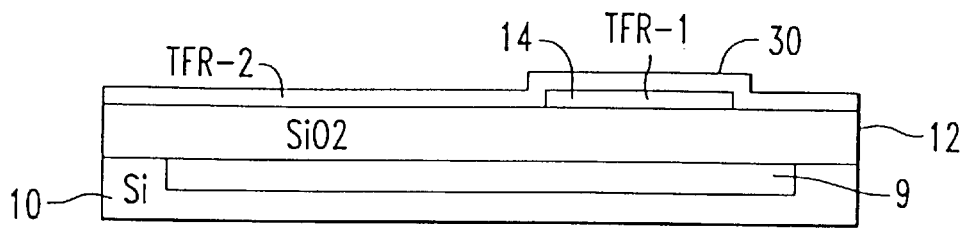
FIGS. 5a–5h show sequential steps in forming first and second thin film resistors on the same, first dielectric layer by direct etching.
Figure 5B:
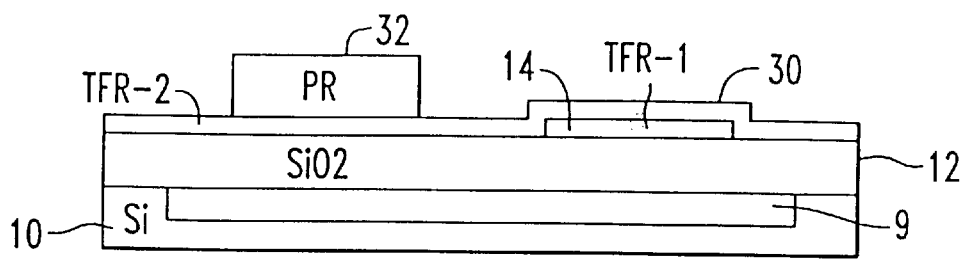
Figure 5C:
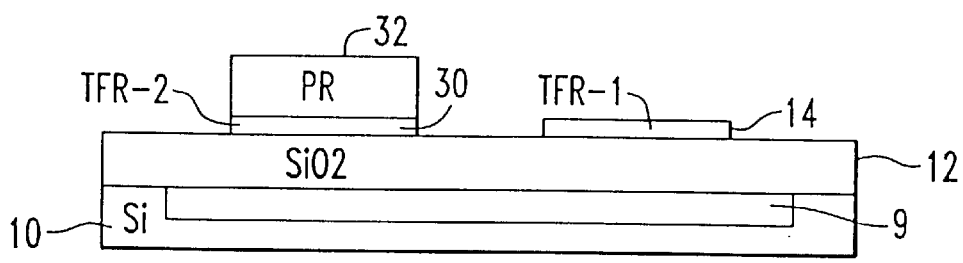

A method for direct etch forming the second thin film resistor on the same, first dielectric layer as the first thin film resistor is shown in FIGS. 5a–5h. With reference to FIG. 5a, the first thin film resistor 14 is formed either by direct etching or by lift off as shown and described in connection with either FIGS. 1a–1e or FIGS. 2a–2e. After formation of the first thin film resistor 14 on the first dielectric layer 12, a uniform layer 30 of second thin film resistor material is deposited over the first dielectric layer 12 and over the first thin film resistor 14. As shown in FIG. 5b, a photoresist layer 32 is uniformly deposited over the structure of FIG. 5a. The photoresist layer 32 is suitably patterned to the shape of the desired second thin film resistor, exposed photoresist is removed, and the remaining photoresist is hard baked to provide a resist material over a portion of the second thin film resistor layer 30. As shown in FIG. 5c, the exposed thin film resistor layer 30 is removed by a suitable etching material that selectively etches material 30 with respect to material 14. A typical etching agent for nichrome is an aqueous solution of ceric sulfate, and sulfuric acid. A typical etching agent for sichrome is a mixture of phosphoric, nitric, and hydrofluoric acid.

Figure 5D:
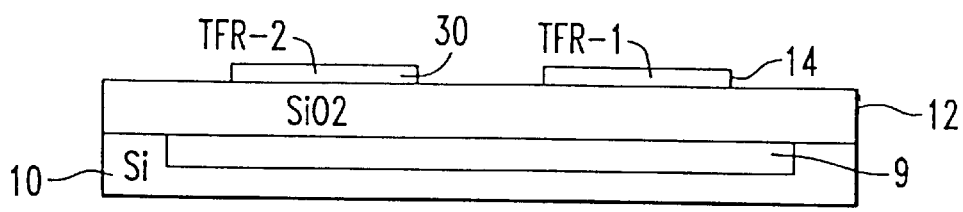
Figure 5E:
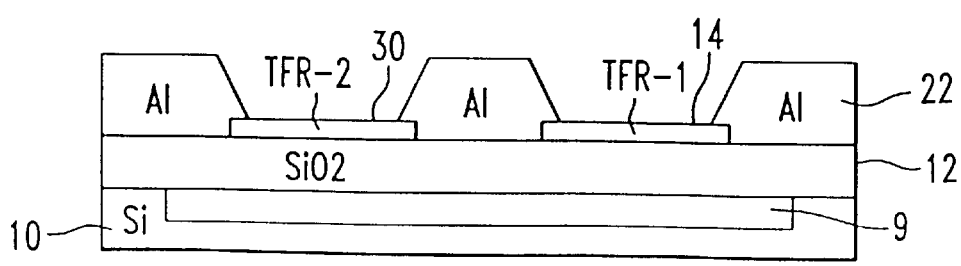
Figure 5F:
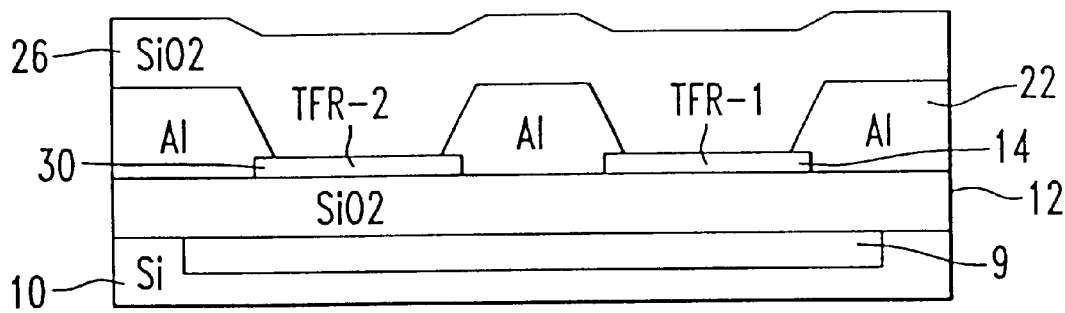
Figure 5G:
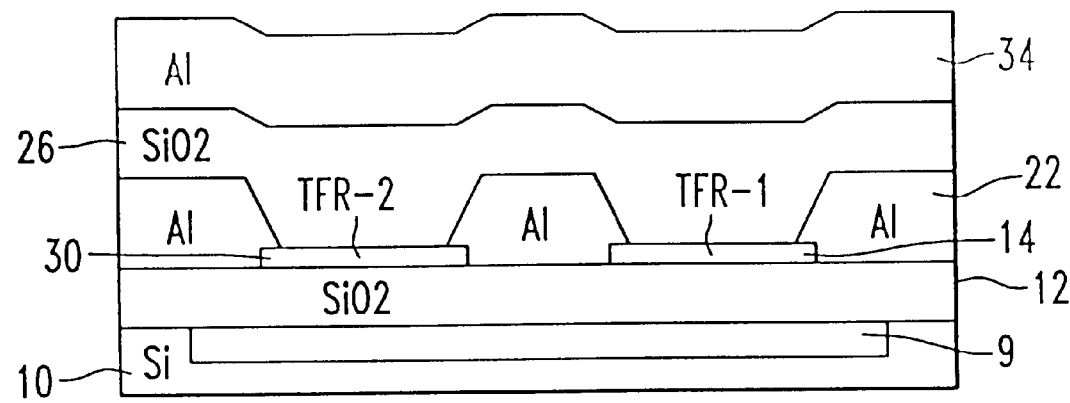
Figure 5H:
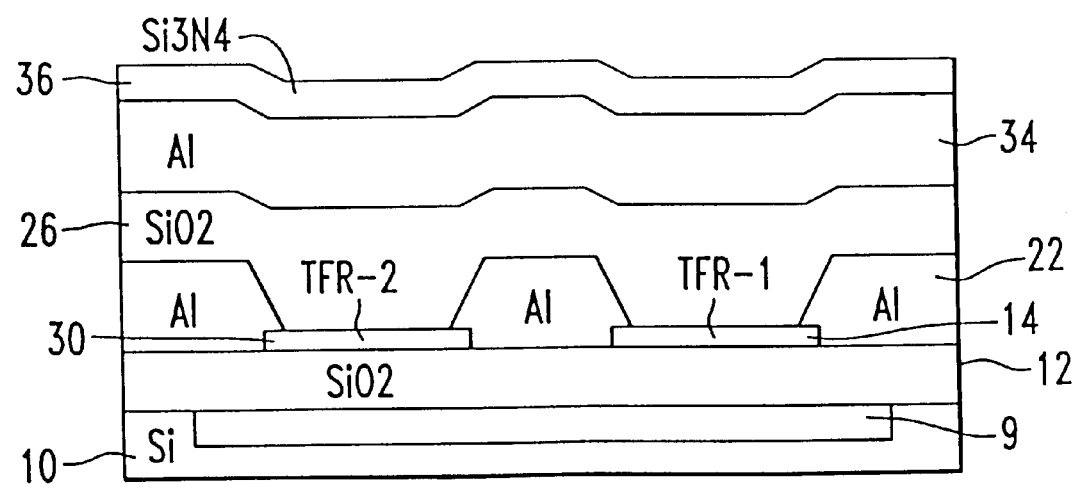

Those skilled in the art will recognize that the first thin film resistor material 14 and the second thin film resistor material 30 are different from each other. One may be nichrome and the other sichrome and either may be of another suitable material. This method will operate so long as the two layers 14, 30 are not of the same material. Next the photoresist 32 is stripped to expose the two thin film resistors as shown in FIG. 5d. The thin film resistors 14, 30 may be suitably trimmed after deposition of the passivation layer. Next, as shown in FIG. 5e, an interconnect layer 22 is uniformly deposited over the first dielectric layer and over the first and second thin film resistors, 14, 30. As described above in connection with FIG. 3, the first level dielectric layer 12 is patterned to include apertures for the interconnect material to contact the integrated circuit 9 in the substrate 10. The aperture pattern provides a suitable alignment target for exposing the thin film resistors 30, 14. Next a second dielectric layer 26 is uniformly deposited over the interconnect level 22 and the thin film resistors 30, 14. The second dielectric layer 26 is patterned with suitable vias extending to at least to the first interconnect level 22 and/or to the integrated circuit 9. As shown in FIG. 5g, a second interconnect level 34 is uniformly deposited over the second dielectric layer 26. Finally, passivation layer 36, as shown in FIG. 5h, is uniformly deposited over the second interconnect level 34.

A second thin film resistor is formed on the same first dielectric layer by a lift off method as shown in FIGS.

Figure 6A:
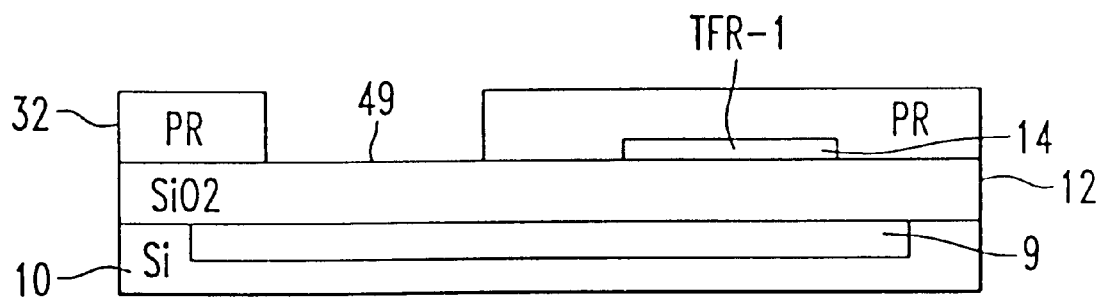
FIGS. 6a–6d show sequential steps in forming a second thin film resistor on the same, first dielectric layer using a lift off method.
Figure 6B:
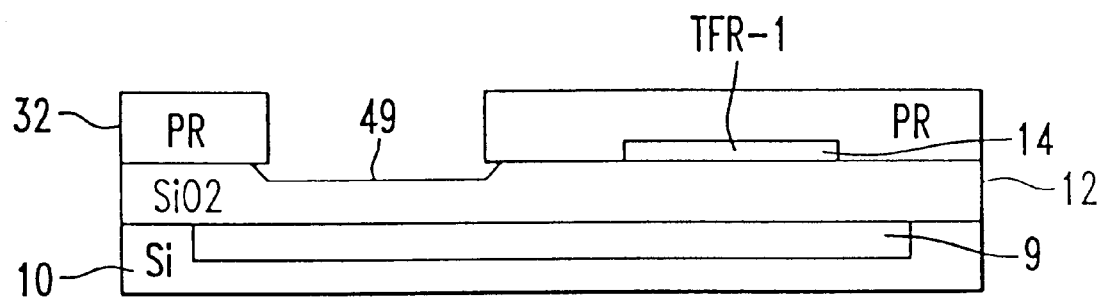

6a–6d. With reference to FIG. 6a, a silicon substrate 10 with a first dielectric layer has a first thin film resistor 14 formed by either the direct etch method of FIG. 1a–1e or by the lift off method FIGS. 2a–2e. In a first step as shown in FIG. 6a, a layer of photoresist 32 is uniformly deposited over the first dielectric layer 12 and over the first thin film resistor 14. The photoresist is patterned and hard baked to provide a suitable resist mask. Next, as shown in FIG. 6b, the exposed portion 49 of the first level dielectric layer 12 is etched in order to increase the distance between the level of the exposed dielectric 12 and the top level of the photoresist 32. Next a uniform layer of second thin film resistor material 30 is deposited over the photoresist layer 32. The result in structure is shown in FIG. 6c.

Figure 6C:
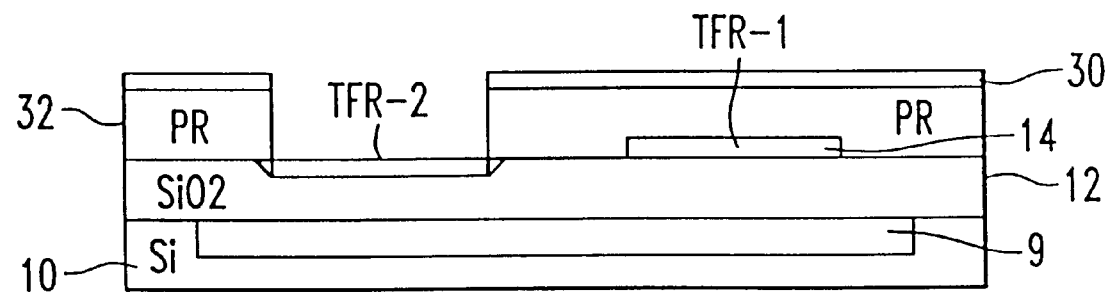
Figure 6D:
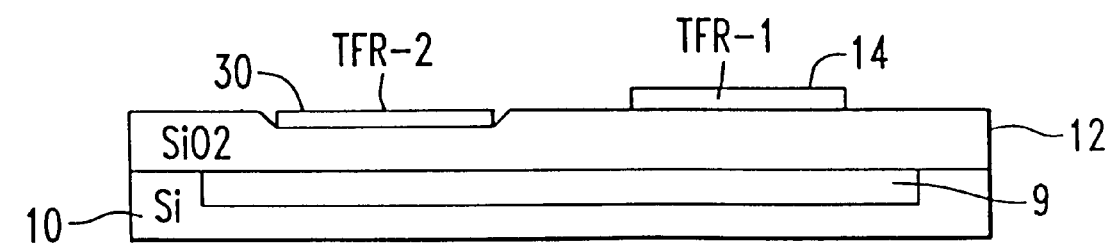

The structure of FIG. 6c is exposed to a suitable solvent to remove the photoresist 32 and thereby expose the first and second thin film resistors 14, 30 both on the first dielectric layer 12. First and second interconnect and passivation layers may be applied to the structure shown in FIG. 6d in substantially the same manner as shown and described in connection with FIGS. 5e–5h.

The methods disclosed in FIGS. 1–6 disclose a method wherein the metal interconnect is in direct contact with the thin film resistors. The method to obtain such direct contact can sometimes damage the thin film resistors. The damage may result from the process to remove the metal layer overlaying the thin film resistor material. One method to prevent such damage is to change the first and second thin film resistors 14, 30 to a first and second coated thin film resistors 72, 76.

Each first coated thin film resistor 72 comprises the first resistor material 14 and a first conductive hard mask material 70. Likewise, each second coated thin film resistor 76 comprises the second resistor material 30 and a second conductive hard mask material 74. The first and second resistor materials 14, 30 are two different materials. The different materials can be nichrome, sichrome, doped sichrome, tantalum-nitride, trinitride and the like. The first and second conductive hard mask materials 70, 74 can be the same or different refractory materials. Such refractory materials comprise titanium, tungsten, molybdenum or mixtures thereof. Preferably, the refractory material is titanium-tungsten.

Figure 7A:
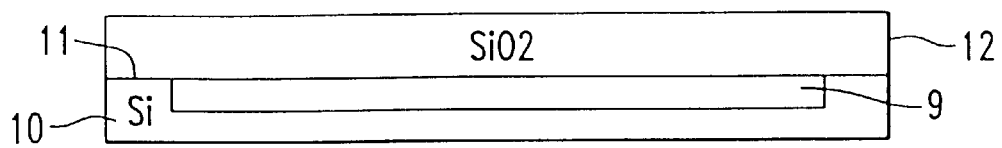
FIGS. 7a–7e show sequential steps in forming a first coated thin film resistor by direct etch.
Figure 7B:
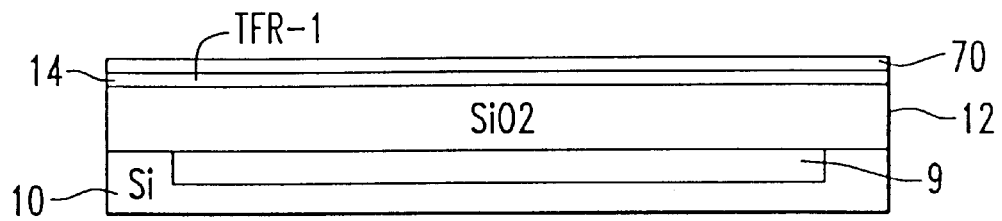
Figure 7C:
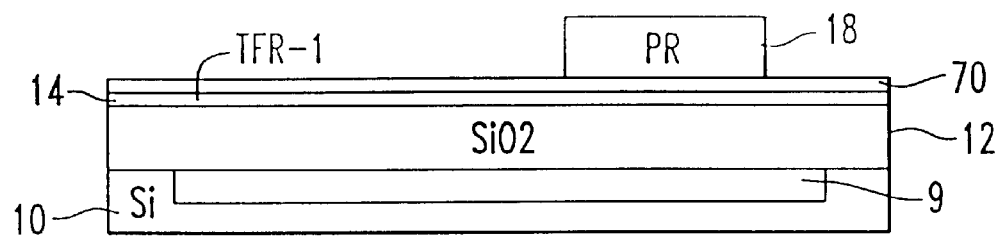
Figure 7D:
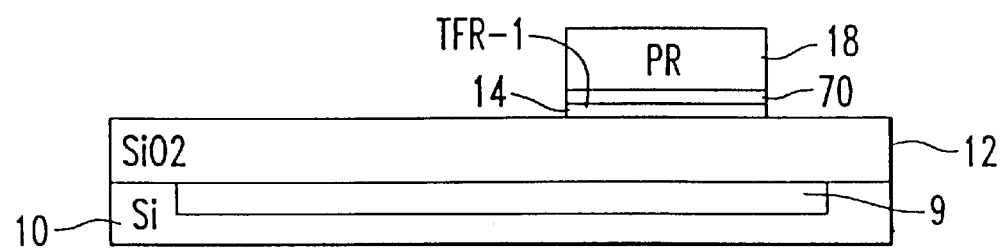
Figure 7E:
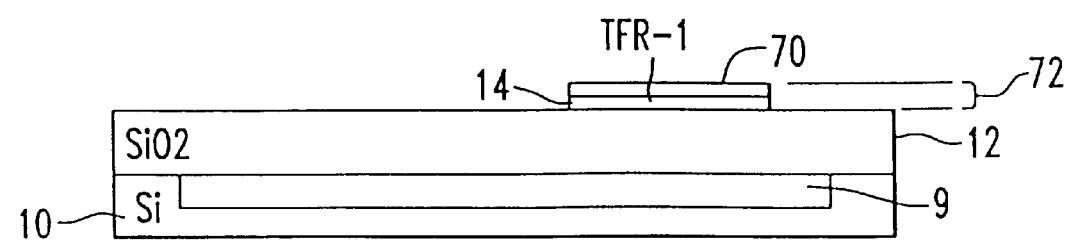

FIG. 7a shows the semiconductor substrate 10 comprising silicon or other suitable semiconductor material. The integrated circuit 9 is formed in the semiconductor substrate 10 by suitable processes. The first dielectric layer 12 is formed on surface 11 of the substrate 10. Next, as shown in FIG. 7b, the layers of the first thin film resistor material 14 and the first conductive mask material 70 are uniformly deposited on the first dielectric layer 12. The layer of photoresist 18 is uniformly deposited on the first conductive mask material 70 and is patterned to the shape of the desired coated thin film resistor. The photoresist 18 (FIG. 7c) covers a portion of the first conductive hard mask material 70 and exposes the rest of the first conductive hard mask material 70 and the first resistor material 14 underlying the exposed first conductive hard mask material 70 to a suitable etching material. The exposed portion of the first conductive hard mask material 70 and underlying first resistor layer 14 is etched as shown in FIG. 7d. Upon removal of the exposed portion of layer 70 and underlying layer 14, the remaining photoresist 18 is striped to leave a first coated thin film resistor 72 on a first dielectric layer 12 as shown in FIG. 7e.

Figure 8A:
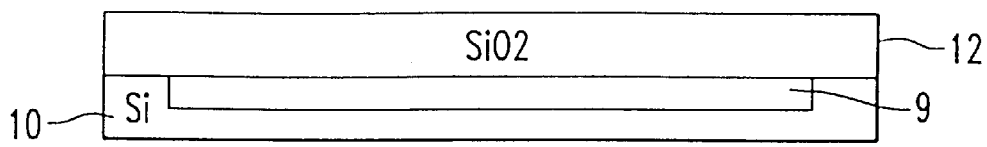
FIGS. 8a–8e show sequential steps in forming a first coated thin film resistor by lift off.
Figure 8B:
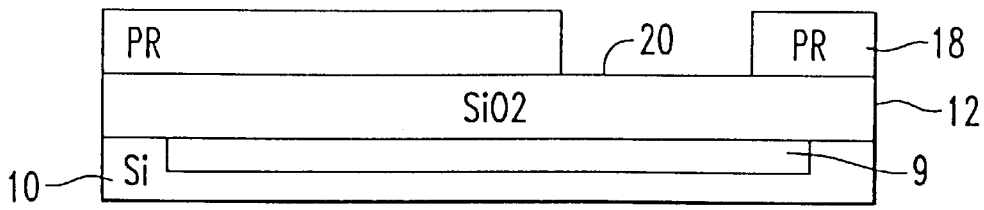
Figure 8C:
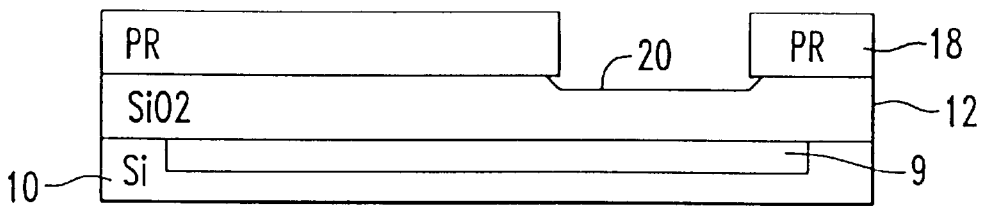
Figure 8D:
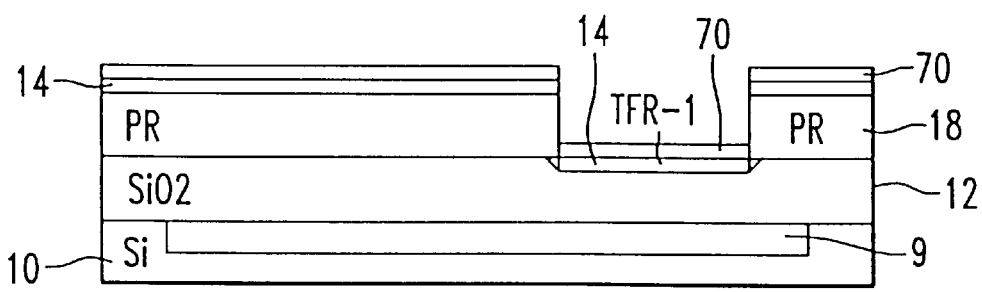
Figure 8E:
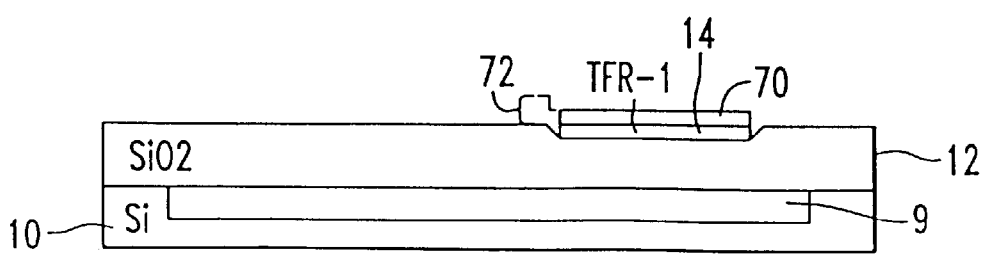

A lift off method is shown in FIGS. 8a–8e. The first dielectric layer 12 is coated with a layer of photoresist 18. The photoresist 18 is suitably patterned to expose an area 20 for the location of the coated thin film resistor. The photoresist is hard baked to provide a suitable mask. As shown in FIG. 8c, the exposed portion of the first dielectric layer 12 is partially etched to displace the exposed surface of the dielectric layer from the surface of the photoresist. As such, it creates a large step between the two levels thereby exposing the sidewalls of the photoresist to a lift off solvent. As shown in FIG. 8d, a uniform layers of first thin film resistor material 14 and a first conductive hard mask material 70 are deposited over the photoresist and the exposed portion 20 of the first level dielectric. The substrate 10 is subjected to a suitable solvent that removes the photoresist and results in the coated thin film resistor 72 as shown in FIG. 8e.

Figure 9A:
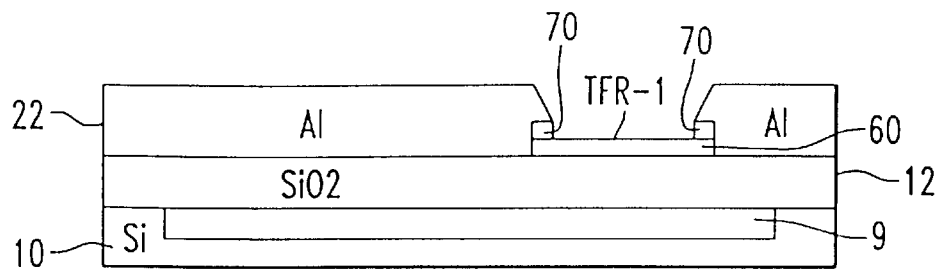
FIGS. 9a–9h show sequential steps in forming a second coated thin film resistor on a different level as the first resistor by direct etch.

FIGS. 9a–9h show a direct etching method for forming a second coated thin film resistor 30 on the second dielectric layer 26 different from the first dielectric layer 12. With reference to FIG. 9a, the first resistor 60 is either the thin film resistor 14 or the first coated thin film resistor 70. The resistor 70 is formed by either the direct etch method of FIGS. 7a–7e or by the lift off method of FIGS. 8a–8e. The resistor 14 is formed by either the direct etch method of FIGS. 1a–1e or by the lift off method of FIGS. 2a–2e. It is preferred that the resistor 60 is the first coated thin film resistor 72 formed by the direct etch method. The first level dielectric layer 12 is suitably patterned to provide apertures (not shown) extending at least to surface contact regions of the integrated circuit 9 in the substrate 10. The metal interconnect layer 22, preferably of aluminum, is suitably deposited uniformly over the first dielectric layer 12 and the first coated thin film resistor 72. In earlier steps, not shown, the aluminum 22 is suitably patterned in order to expose portions of the first coated thin film resistor 72 and the exposed first conductive mask material 70 is removed so the aluminum 22 contacts the first coated thin film resistor 72 through the remaining first conductive hard mask material. These earlier steps result in the structure shown in FIG. 9a.

Figure 9B:
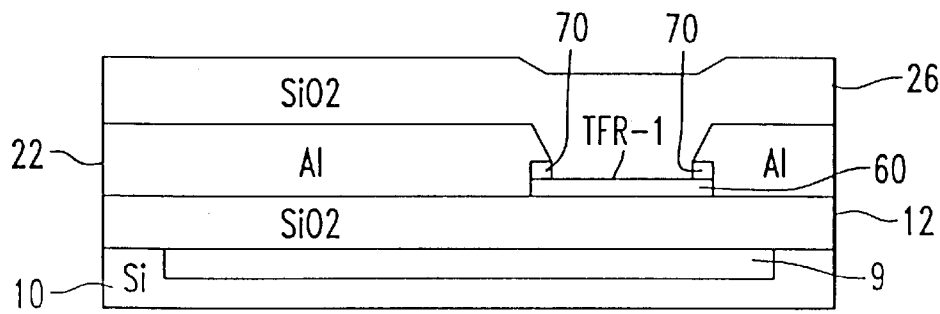
Figure 9C:
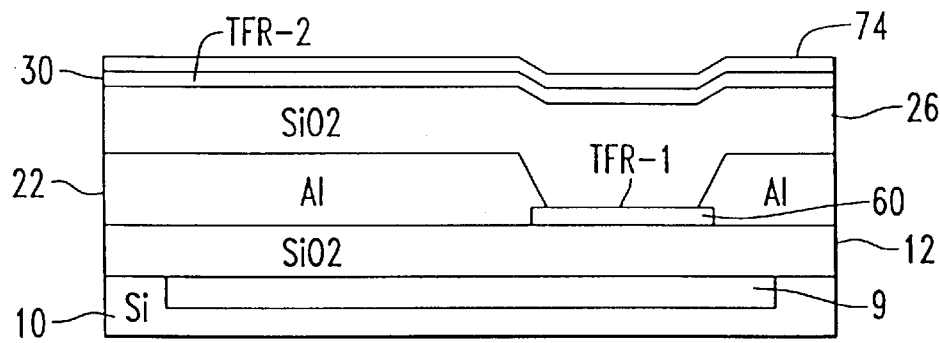
Figure 9D:
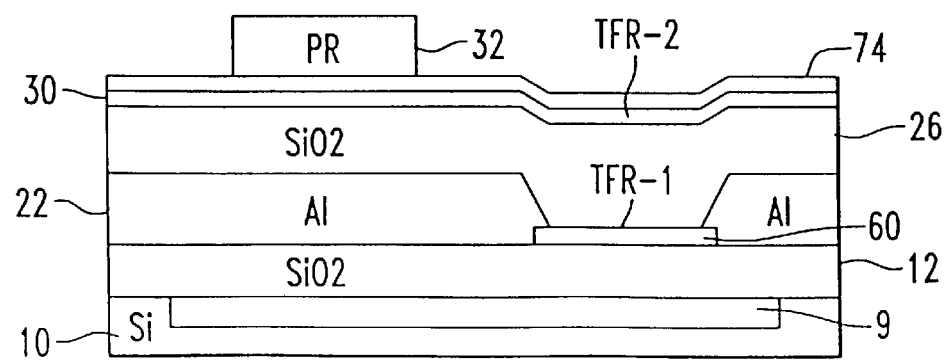
Figure 9E:
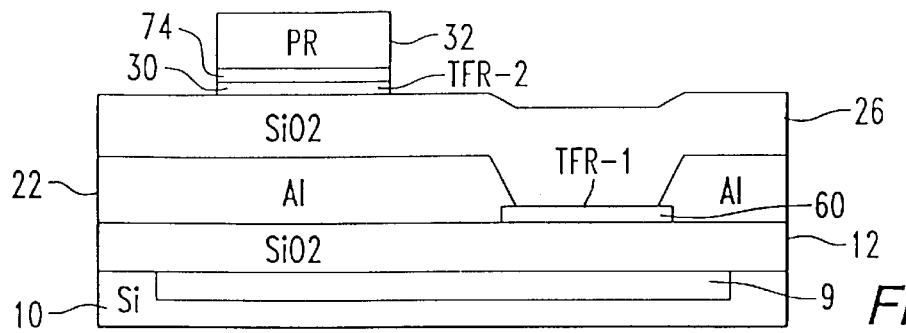
Figure 9F:
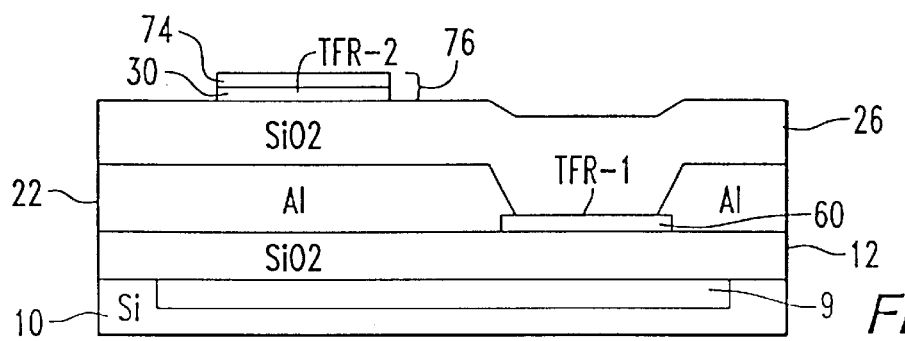

The first coated thin film resistor 72 is then covered with the second dielectric layer 26 as shown in FIG. 9b. The second thin film resistor material 30 and the conductive hard mask material 74 are uniformly deposited over the second dielectric layer 26. See FIG. 9c. As shown in FIG. 9d, the second conductive hard mask material 74 is covered with the layer 32 of photoresist. The photoresist is suitably patterned, developed and hard baked to provide the structure as shown in FIG. 9e. That structure is etched to remove the exposed portions of layer 74 and the layer 30 that underlies the exposed layer 74. The resulting structure is shown in FIG. 9f.

Figure 9G:
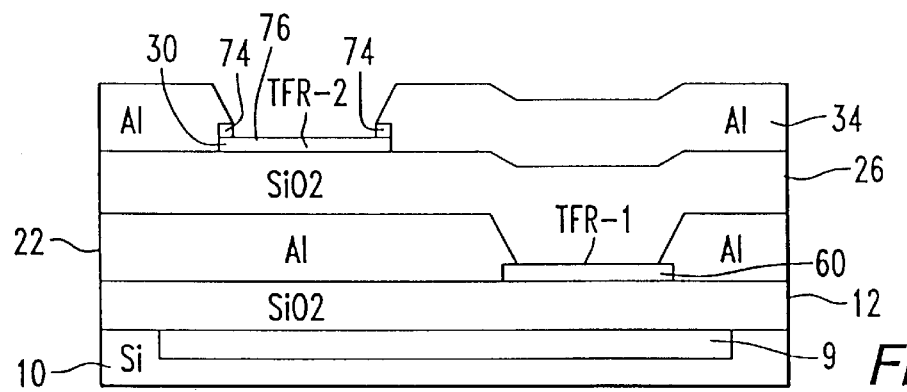

Thereafter, the photoresist is stripped to provide the second coated thin film resistor 76 on the second dielectric layer 26. In a manner similar to that described at the beginning of this method, the second interconnect level 34 is formed over the structure of FIG. 9g. Prior to forming the interconnect layer 34, suitable vias are etched at least through the second level dielectric layer 26 and extending to the first level interconnect layer 22. The vias may be further etched through the first dielectric layer 12 to contact the integrated circuit 9. After the layer 34 is deposited, it is suitably patterned to exposed the second coated thin film resistor 76. The exposed second conductive mask material 74 is removed by conventional processes known to those skilled in the art. The interconnect layer contacts the second resistor material 30 through the second conductive mask material 74 as shown in FIG. 9g. A passivation dielectric layer 36, typically silicon nitride, is uniformly deposited over the structure as shown in FIG. 9h.

Figure 10A:
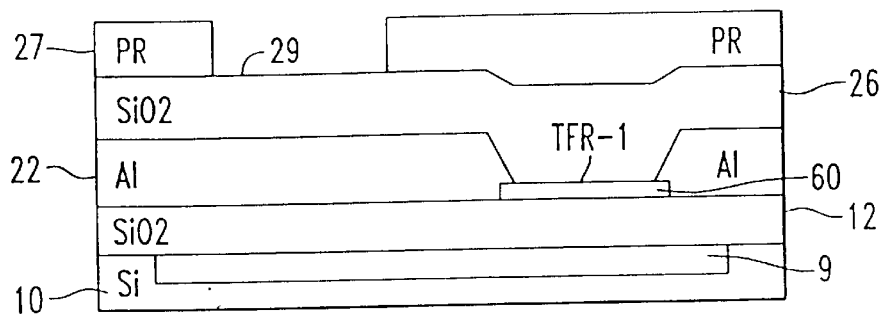
FIGS. 10a–10d show sequential steps in forming a second coated thin film resistor on a different level as the first resistor by lift off.
Figure 10B:
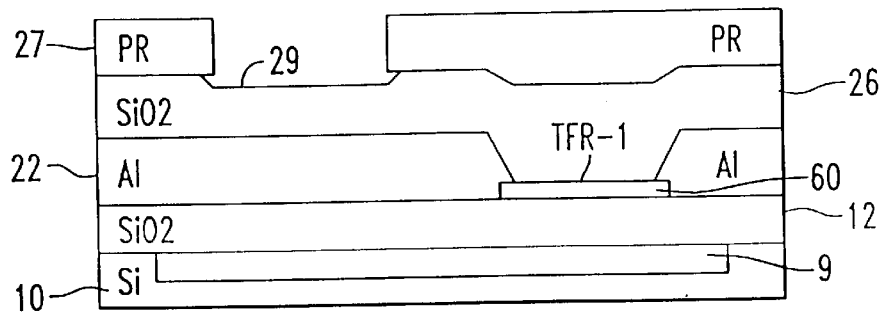
Figure 10C:
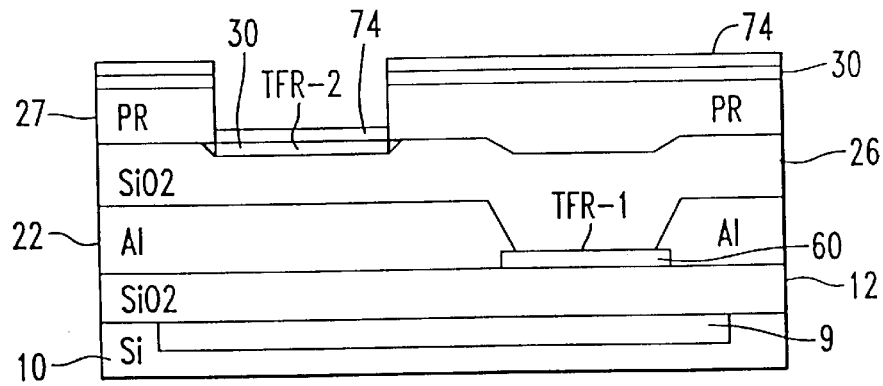
Figure 10D:
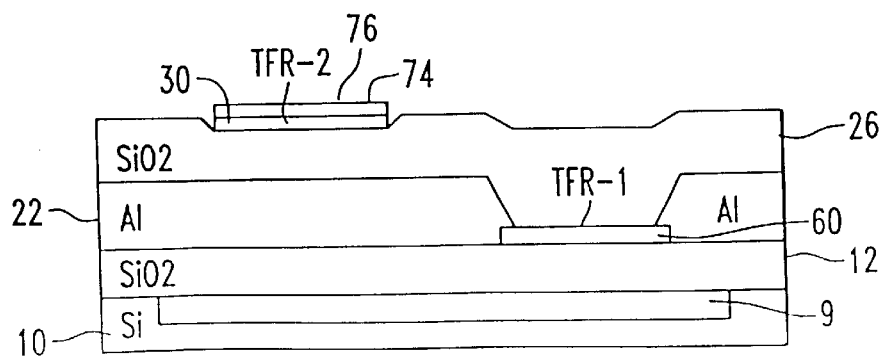

A second coated thin film resistor 76 may also be formed by the lift off method as shown in FIGS. 10a–10d. The structure shown in FIG. 10a is formed by substantially the same steps described in connection with FIGS. 1a–1e, 2a–2e, 7a–7e and 8a–8e. After deposition of the second dielectric layer 26, the photoresist layer 27 is deposited over the second dielectric layer 26. The resist pattern 29 is etched into the exposed portion of the photoresist layer in order to assist the lift off process and into the second dielectric layer 26. The resist pattern 29 is shown in FIG. 10b. Next, as shown in FIG. 10c, the uniform layers of second thin film resistor material 30 and second conductive hard mask material 74 are deposited over the structure of FIG. 10b. In a following step, the photoresist 27 is removed by a suitable solvent thereby leaving the second coated thin film resistor 76 on the second dielectric layer 26 as shown in FIG. 10d.

Figure 9H:
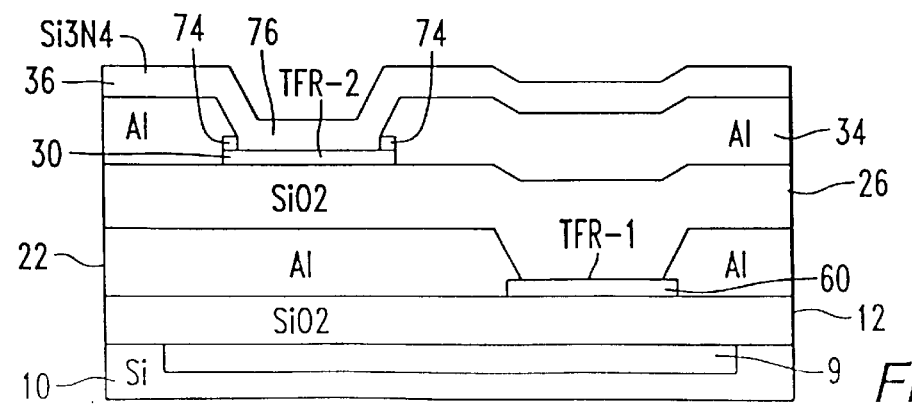

Those skilled in the art will appreciate that a second interconnect layer and a passivation layer may be formed over the structure shown in FIG. 10d in a manner substantially the same as that shown in FIGS. 9g and 9h and described above.

Figure 11A:
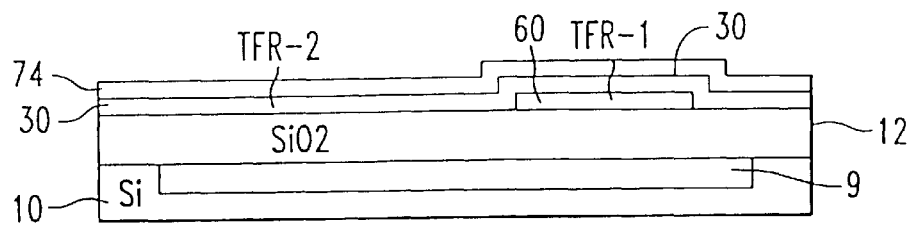
FIGS. 11a–11h show sequential steps in forming a second coated thin film resistor on the same level as the first resistor by direct etch.

A method for direct etch forming the second coated thin film resistor 76 on the same, first dielectric layer as the first coated thin film resistor 72 is shown in FIGS. 11a–11h. With reference to FIG. 11a, the resistor 60 is either the first coated thin film resistor 72 or the thin film resistor 14. Resistor 72 is formed either by direct etching or by lift off as shown and described in connection with either FIGS. 7a–7e or FIGS. 8a–8e. Resistor 14 is formed either by direct etching or by lift off as shown and described in connection with either FIGS. 1a–1e or FIGS. 2a–2e. Preferably, resistor 60 is the coated thin film resistor 72 formed by direct etch.

Figure 11B:
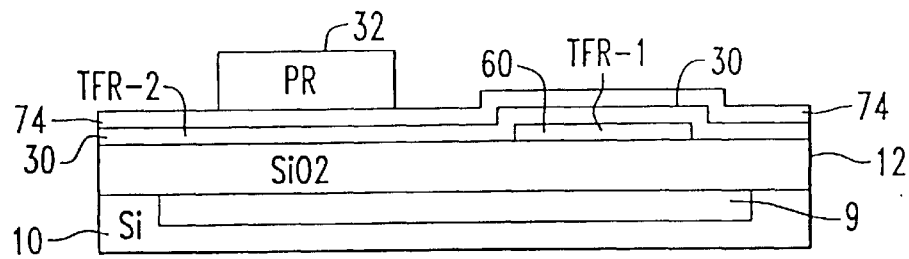
Figure 11C:
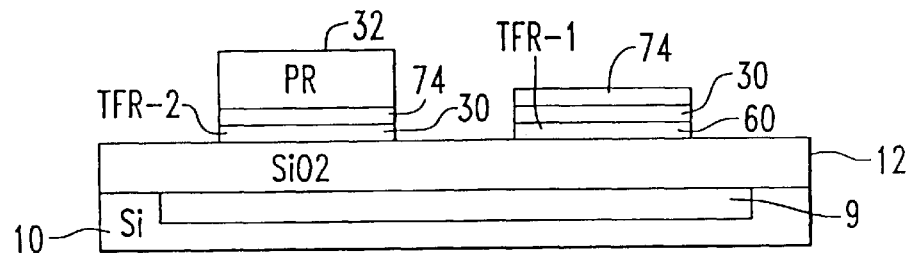

After formation of the resistor 60 on the first dielectric layer 12, the uniform layers of the second thin film resistor material 30 and the second conductive mask material 74 are deposited over the first dielectric layer 12 and over the resistor 60. As shown in FIG. 11b, the photoresist layer 32 is uniformly deposited over the structure of FIG. 11a. The photoresist layer 32 is suitably patterned to the shape of the desired second coated thin film resistor, exposed photoresist is removed, and the remaining photoresist is hard baked to provide a resist material over a portion of the second coated thin film resistor layer 76. As shown in FIG. 11c, the exposed second conductive hard mask material 74 and the thin film resistor material 30 that underlies the exposed second conductive hard mask material 74 are removed by a suitable etching material that selectively etches materials 74, 30 with respect to materials 70, 14. A typical etching agent for nichrome is an aqueous solution of ceric sulfate, and sulfuric acid. A typical etching agent for sichrome is a mixture of phosphoric, nitric, and hydrofluoric acid.

Figure 11D:
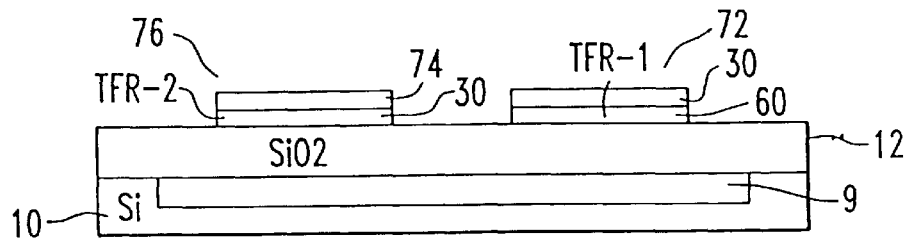
Figure 11E:
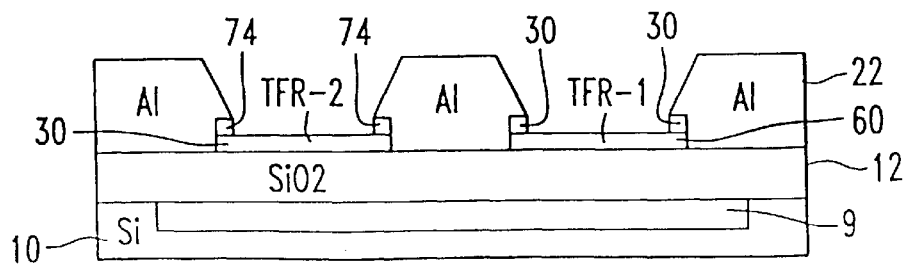
Figure 11F:
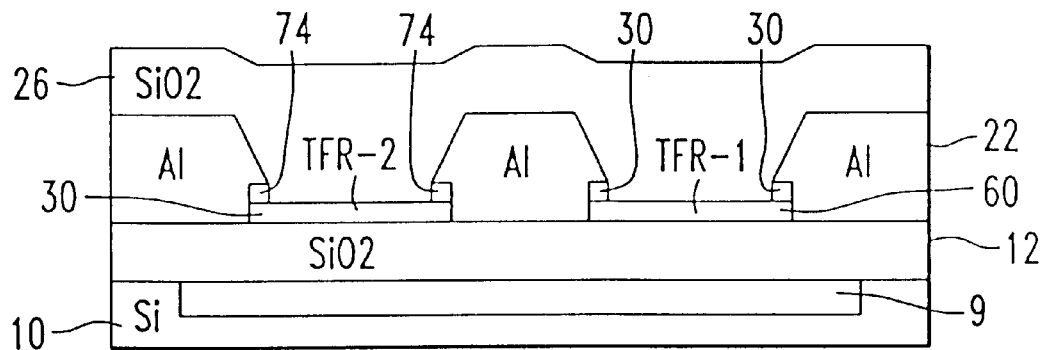
Figure 11G:
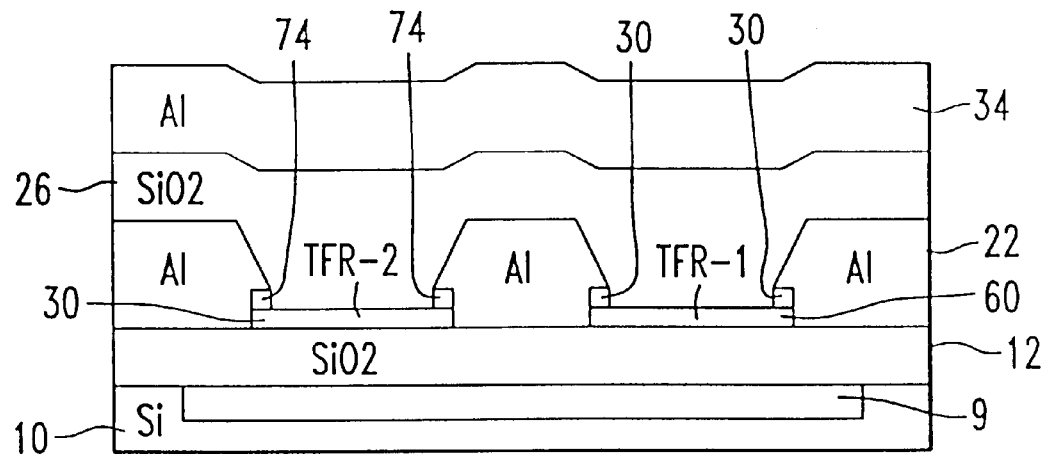
Figure 11H:
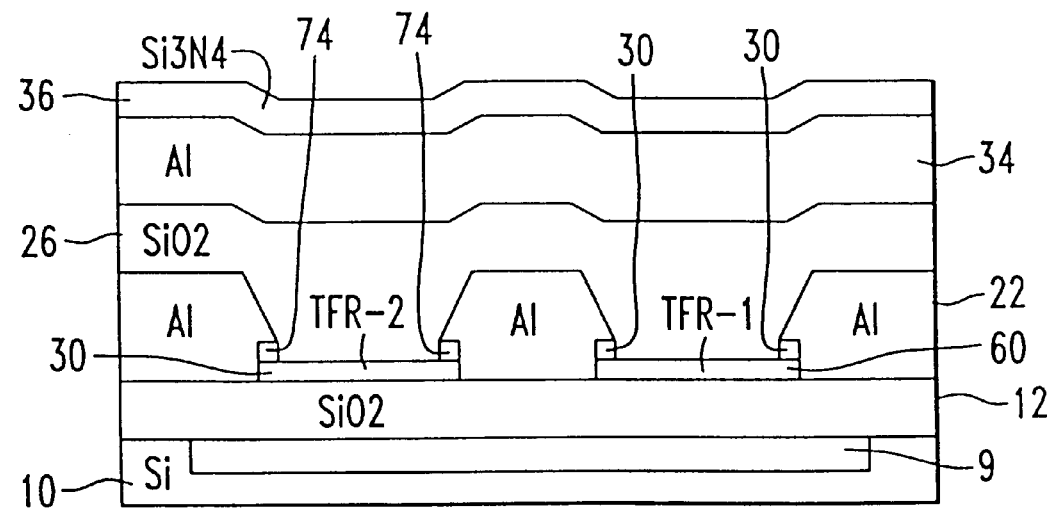

Those skilled in the art will recognize that the first resistor material 14 and the second resistor material 30 are different from each other. One may be nichrome and the other sichrome and either may be of another suitable material. This method will operate so long as the two layers 14, 30 are not of the same material. Next the photoresist 32 is stripped to expose the coated thin film resistors 76 and resistor 60 (preferably the coated thin film resistor 72) as shown in FIG. 11d. The coated thin film resistors 72, 76 may be suitably trimmed after deposition of the passivation layer. Next, as shown in FIG. 11e, an interconnect layer 22 is uniformly deposited over the first dielectric layer and over the first and second coated thin film resistors, 72, 76. The interconnect layer is patterned and removed to expose portions of the first and second conductive mask material 70, 74. The exposed first and second conductive mask materials 70, 74 are removed so the interconnect layer connects to the conductive mask material on each first and second coated thin film resistor 72, 76. As described above in connection with FIG. 9, the first level dielectric layer 12 is patterned to include apertures for the interconnect material to contact the integrated circuit 9 in the substrate 10. The aperture pattern provides a suitable alignment target for exposing the coated thin film resistors 72, 76. Next a second dielectric layer 26 is uniformly deposited over the interconnect level 22 and the coated thin film resistors 72, 76. The second dielectric layer 26 is patterned with suitable vias extending to at least to the first interconnect level 22 and/or to the integrated circuit 9. As shown in FIG. 11g, a second interconnect level 34 is uniformly deposited and patterned over the second dielectric layer 26. Finally, passivation layer 36, as shown in FIG. 11h, is uniformly deposited over the second interconnect level 34.

Figure 12A:
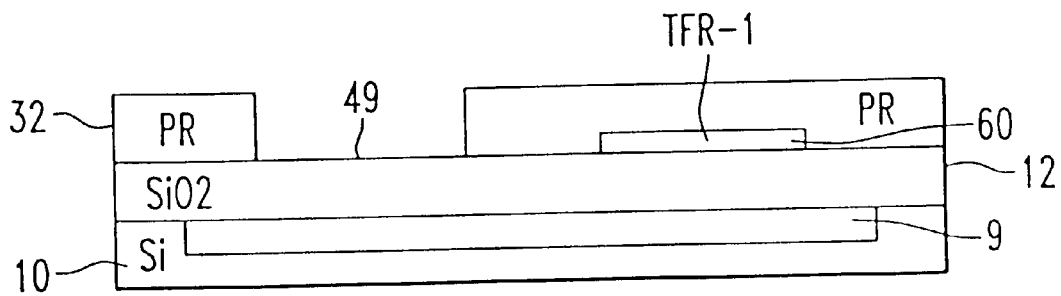
FIGS. 12a–12d show sequential steps in forming a second coated thin film resistor on the same level as the first resistor by lift off.
Figure 12B:
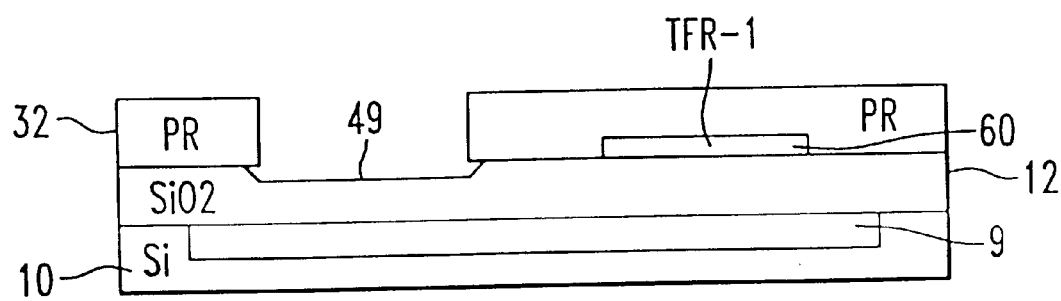
Figure 12C:
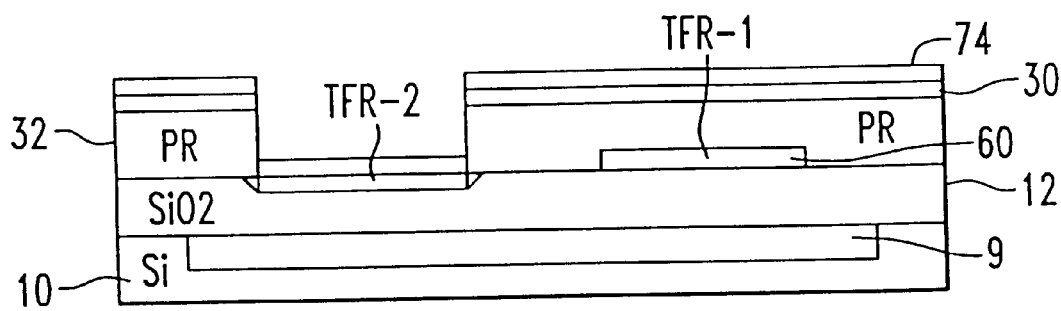
Figure 12D:
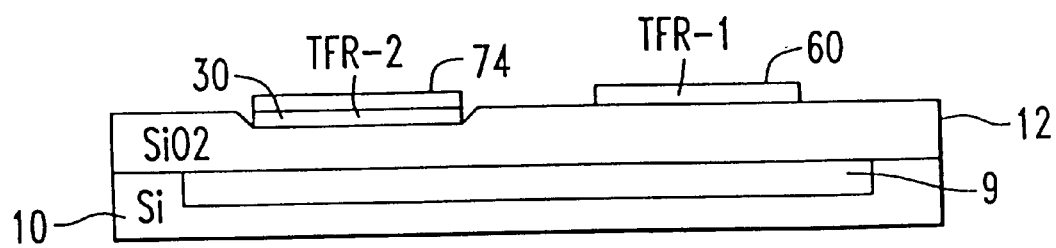

A second coated thin film resistor 76 is formed on the same first dielectric layer by a lift off method as shown in FIGS. 12a–12d. With reference to FIG. 12a, a silicon substrate 10 with a first dielectric layer has a first coated thin film resistor 72 formed by either the direct etch method of FIG. 7 or by the lift off method FIG. 8. In a first step as shown in FIG. 12a, a layer of photoresist 32 is uniformly deposited over the first dielectric layer 12 and over the first resistor 60. The photoresist is patterned and hard baked to provide a suitable resist mask. Next, as shown in FIG. 12b, the exposed portion 49 of the first level dielectric layer 12 is etched in order to increase the distance between the level of the exposed dielectric 12 and the top level of the photoresist 32. Next uniform layers of second thin film resistor material 30 and second conductive hard mask material 74 are deposited over the photoresist layer 32. The result in structure is shown in FIG. 12c.

The structure of FIG. 12c is exposed to a suitable solvent to remove the photoresist 32 and thereby expose the first and second resistors 60, 76 both on the first dielectric layer 12. First and second interconnect and passivation layers may be applied to the structure shown in FIG. 12 in substantially the same manner as shown and described in connection with FIGS. 11e–11h.

Figure 13A:
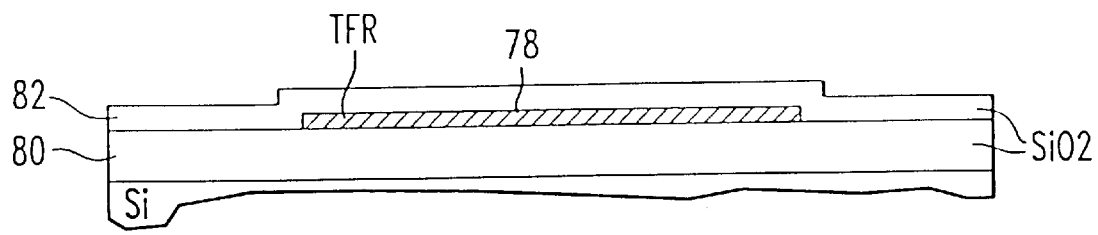
FIGS. 13a–13c show sequential steps to add an interconnect metal by direct etch.
Figure 13B:
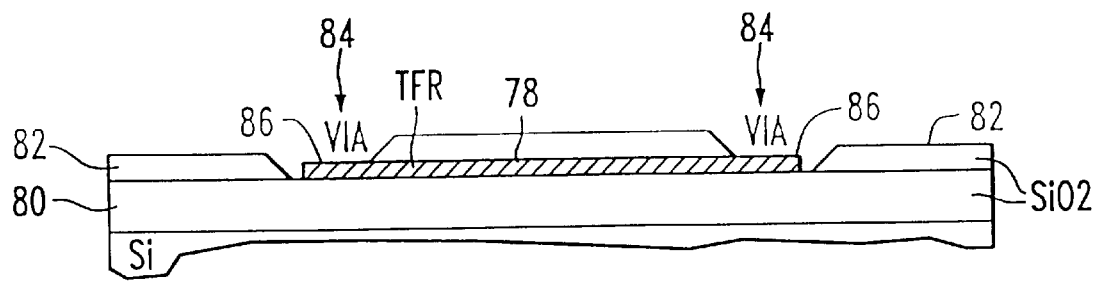
Figure 13C:
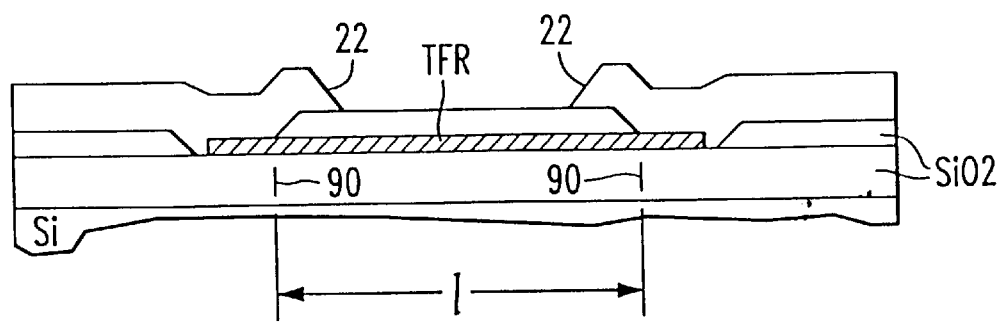

An alternative embodiment to apply the interconnect layers by a direct etch method is shown in FIGS. 13a–c. In FIG. 13a shows a resistor 78 overlaying a dielectric layer 80. The resistor 78 is either a thin film resistor 14, 30 or coated thin film resistor 72, 76. If the coated thin film resistor 72, 76 is used, the conductive mask material must be removed from the conductive path of the resistor material. The dielectric layer 80 is either dielectric layer 12 or 26 and is over a substrate (not shown). A third dielectric layer 82 is deposited on the resistor 78 and the dielectric layer 80. Preferably, the third dielectric layer is an oxide such as silicon oxide and is deposited as a thin layer (around 500 Å).

Vias 84 are patterned and etched down to the terminals 86 of the resistor 78 as shown in FIG. 13b. Preferably, the via etch process does not damage the resistor 78 since the resistor 78 is exposed once the vias are formed.

Metal interconnect layer, like aluminum 22, is deposited, patterned and etched so the metal interconnects to the terminals 86 as shown in FIG. 13c. Since the resistor 78 is encapsulated, the etch method used for the metal interconnect layer need not be selective with respect to the resistor 78 material used. The length (L) of the resistor 78 is from the inner edges 90 of the via 84.

Figure 14A:
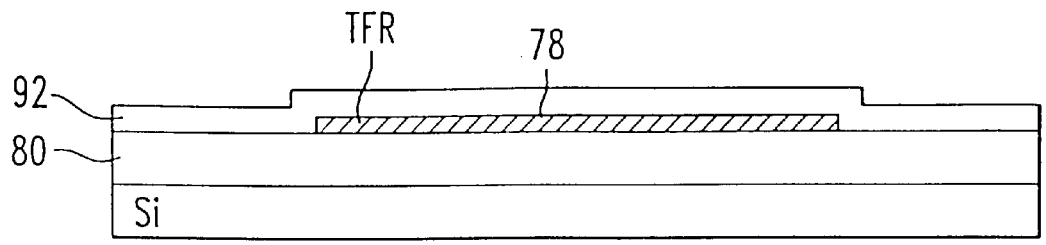
FIGS. 14a–14d show sequential steps to add an interconnect metal by lift off.
Figure 14B:
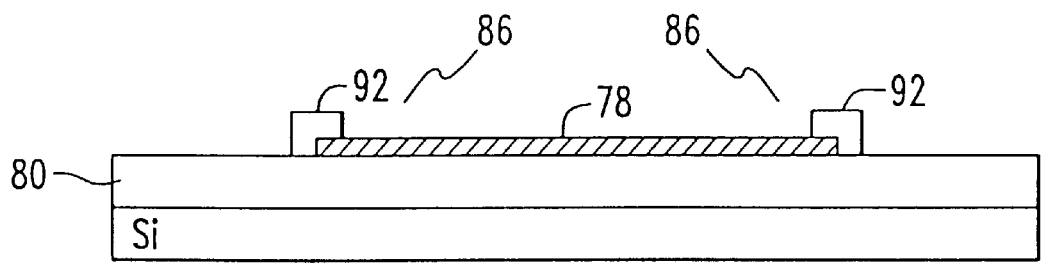
Figure 14C:
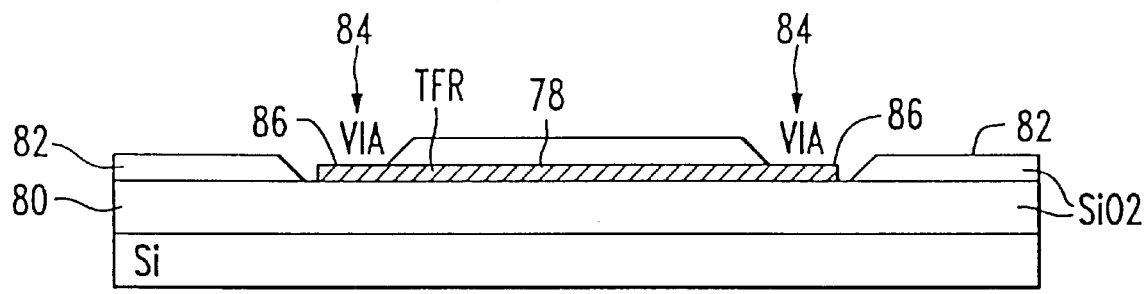

Another alternative embodiment to apply the interconnect layers is shown in FIGS. 14a–d. In FIG. 14a shows a resistor 78 overlaying a dielectric layer 80. A first photoresist material 92 is applied and patterned over the dielectric layer 80 and the resistor 78 to expose portions of the dielectric layer 80 and the resistor 78, except the terminals 86 as shown in FIG. 14b. The third dielectric layer 82 is deposited on the exposed portions 80, 78. The photoresist material 92 is removed to form the structure shown in FIG. 14c.

Figure 14D:
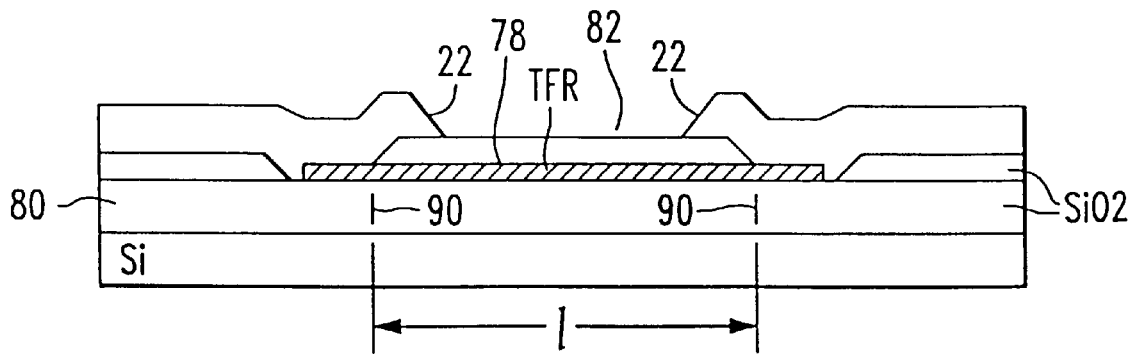

Metal interconnect layer, like aluminum 22, is deposited, patterned and etched so the metal interconnects to the terminals 86 as shown in FIG. 14d. Since the resistor 78 is encapsulated, the etch method used for the metal interconnect layer need not be selective with respect to the resistor 78 material used. The length (L) of the resistor 78 is from the inner edges 90 of the via 84.

Having thus described the preferred embodiments of the invention, those skilled in the art will appreciate that further additions, changes, deletions, and alterations may be made to above described processes and structures without departing from the spirit and the scope of the invention as set forth in the following claims.

What we claim:

1. An integrated circuit formed in a semiconductor substrate comprising
    a first dielectric layer formed over the integrated circuit;
    a first thin film resistor of a first resistor material on the first dielectric material;
    a second thin film resistor of a second resistor material different from the first resistor material formed on the first dielectric material;
    a first conductive hard mask material on at least a portion of the top surface of the first thin film resistor to form a first coated thin film resistor;
    a second conductive hard mask material on at least a portion of the top surface of the second thin film resistor to form a second coated thin film resistor; and
    an interconnect metal layer patterned to interconnect at least the first and second coated thin film resistors to the integrated circuit
    wherein the interconnect metal connects to the first and second conductive hard mask materials.

2. The circuit of claim 1, wherein the first and second conductive hard mask materials are refractory materials.

3. The circuit of claim 2, wherein the refractory materials comprise at least one element selected from the group consisting of titanium, tungsten, molybdenum and alloys thereof.

4. The circuit of claim 3, wherein the refractory materials are titanium-tungsten.

5. The circuit of claim 1, wherein the first and second conductive hard mask materials are different.

6. The circuit of claim 1, wherein the first and second resistor materials comprise two different materials selected from the group consisting of nichrome, sichrome, sichrome-B, sichrome-C and tantalum nitride.

7. The circuit of claim 1, wherein hard mask material is on at least one side edge of each thin film resistor.

8. An integrated circuit formed in a semiconductor substrate comprising
    a first dielectric layer formed over the integrated circuit;
    a first coated thin film resistor on the first dielectric layer and comprising a first resistor material and a first conductive hard mask material on at least a portion of the top surface of the first resistor material;
    a second dielectric layer on said first coated thin film resistor and first dielectric layer;
    a second coated thin film resistor on said second dielectric layer and comprising a second resistor material different from the first resistor material and a second conductive hard mask material on at least a portion of the top surface of the second resistor material; and
    one or more interconnect metal layers patterned to interconnect said first and second coated thin film resistors to the integrated circuit.

9. The circuit of claim 8 wherein the first and second conductive hard mask materials are refractory materials.

10. The circuit of claim 9 wherein the refractory materials comprising at least one element selected from the group consisting of titanium, tungsten, and molybdenum.

11. The circuit of claim 10 wherein the refractory materials are titanium-tungsten.

12. The circuit of claim 8 wherein the first and second co mask materials are different.

13. The circuit of claim 8 wherein each of the first and second resist materials is selected from the group consisting of nichrome, sichrome, sichrome-B, sichrome-C, and tantalum nitride.

14. The circuit of claim 8 wherein the portion of the top surface of is each of the first and second coated thin film resistors is at least one side edge.

15. An integrated circuit formed in a semiconductor substrate, comprising:
    a first dielectric layer formed over the integrated circuit;
    a first thin film resistor of a first resistor material;
    a second dielectric layer patterned on the first dielectric layer and a second thin film resistor on said second dielectric layer; and
    a metal layer patterned on the first dielectric layer and interconnecting the thin film resistors to an electronic device.

* * * * *